(12) United States Patent
Trainor et al.

(10) Patent No.: US 9,835,691 B2
(45) Date of Patent: Dec. 5, 2017

(54) EMERGENCY LIGHTING SYSTEMS AND METHODS FOR SOLID STATE LIGHTING APPARATUS

(75) Inventors: John J. Trainor, Raleigh, NC (US);
James A. McBryde, Raleigh, NC (US);
Randall L. Powers, Raleigh, NC (US);
Michael J. Harris, Cary, NC (US);
Patrick J. O'Flaherty, Morrisville, NC (US)

(73) Assignee: Cree, Inc., Durham, NC (US)

(*) Notice: Subject to any disclaimer, the term of this patent is extended or adjusted under 35 U.S.C. 154(b) by 553 days.

(21) Appl. No.: 13/466,304

(22) Filed: May 8, 2012

(65) Prior Publication Data
US 2013/0127362 A1    May 23, 2013

Related U.S. Application Data

(60) Provisional application No. 61/569,588, filed on Dec. 12, 2011.

(51) Int. Cl.
| | | |
|---|---|---|
| *G01R 31/44* | (2006.01) | |
| *H05B 33/08* | (2006.01) | |
| *G01R 31/40* | (2014.01) | |

(52) U.S. Cl.
CPC ......... *G01R 31/44* (2013.01); *H05B 33/0842* (2013.01); *G01R 31/40* (2013.01)

(58) Field of Classification Search
CPC .. G01R 31/44; G01R 31/40; G01R 19/16547; G01R 31/08; H05B 37/02; H05B 37/03; H05B 33/0884; H05B 33/0842; H05B 33/0827; H05B 33/0854; H05B 33/0872; H05B 33/0875; H02J 9/00; H02J 9/02; H02J 3/005; H02J 3/006; H02J 9/04;
(Continued)

(56) References Cited

U.S. PATENT DOCUMENTS

| | | |
|---|---|---|
| 4,890,004 A | 12/1989 | Beckerman |
| 5,151,679 A | 9/1992 | Dimmick |
| 5,408,403 A | 4/1995 | Nerone et al. |

(Continued)

FOREIGN PATENT DOCUMENTS

| | | |
|---|---|---|
| JP | 2011 150852 A | 8/2011 |
| WO | WO 2010/127366 A2 | 11/2010 |

(Continued)

OTHER PUBLICATIONS

Invitation to Pay Additional Fees Corresponding to International Application No. PCT/US12/68984; dated Feb. 1, 2013; 2 Pages.
(Continued)

*Primary Examiner* — Jimmy Vu
*Assistant Examiner* — Henry Luong
(74) *Attorney, Agent, or Firm* — Myers Bigel, P.A.

(57) ABSTRACT

An emergency lighting module for providing emergency power to a solid state luminaire. The emergency lighting module includes a first input configured to receive a DC input voltage from the solid state luminaire, a second input configured to receive a status signal indicative of the status of an AC line voltage, and a first output configured to supply a DC output voltage to the solid state luminaire. The emergency lighting module is configured to supply the DC output voltage to the solid state luminaire in response to a reduction of the AC line voltage.

32 Claims, 19 Drawing Sheets

(58) Field of Classification Search
CPC ... H02J 9/065; H02J 11/00; F21V 9/00; F21V 25/00; F21S 9/022; F21Y 2113/005
USPC .................. 315/291, 297, 307–308; 362/20
See application file for complete search history.

(56) References Cited

U.S. PATENT DOCUMENTS

| | | | |
|---|---|---|---|
| 5,488,269 | A | 1/1996 | El-Hamamsy et al. |
| 5,734,230 | A | 3/1998 | Edwards et al. |
| 5,808,417 | A | 9/1998 | Ference et al. |
| 5,847,550 | A | 12/1998 | Schie et al. |
| 6,507,157 | B1 | 1/2003 | Erhardt et al. |
| 6,509,657 | B1 | 1/2003 | Wong et al. |
| 7,027,010 | B2 | 4/2006 | Lee |
| 7,088,059 | B2 | 8/2006 | McKinney |
| 7,138,994 | B2 | 11/2006 | Cho et al. |
| 7,511,971 | B2 | 3/2009 | Lim |
| 8,310,172 | B2 | 11/2012 | Negrete |
| 8,461,794 | B2 | 6/2013 | Schrod et al. |
| 2002/0101362 | A1 | 8/2002 | Nishimura |
| 2003/0193245 | A1 | 10/2003 | Powers |
| 2003/0197447 | A1 | 10/2003 | Yamamoto |
| 2004/0170015 | A1 | 9/2004 | Hamrick |
| 2004/0178766 | A1 | 9/2004 | Bucur et al. |
| 2005/0029966 | A1 | 2/2005 | Buonocunto |
| 2005/0135103 | A1 | 6/2005 | Evans |
| 2006/0066258 | A1 | 3/2006 | Lane et al. |
| 2007/0273290 | A1 | 11/2007 | Ashdown et al. |
| 2008/0055077 | A1 | 3/2008 | Lane et al. |
| 2008/0122376 | A1 | 5/2008 | Lys |
| 2008/0224617 | A1 | 9/2008 | Keller et al. |
| 2008/0258628 | A1 | 10/2008 | Higley et al. |
| 2008/0276509 | A1 | 11/2008 | Yu |
| 2008/0295371 | A1 | 12/2008 | Hsu |
| 2009/0085490 | A1 | 4/2009 | Awalt et al. |
| 2009/0295776 | A1 | 12/2009 | Yu et al. |
| 2009/0296384 | A1 | 12/2009 | Van de Ven et al. |
| 2010/0079091 | A1 | 4/2010 | Deixler et al. |
| 2010/0135000 | A1 | 6/2010 | Smith, III et al. |
| 2010/0237840 | A1 | 9/2010 | Walter et al. |
| 2010/0244569 | A1 | 9/2010 | Chandler et al. |
| 2010/0259239 | A1 | 10/2010 | Shi et al. |
| 2010/0271802 | A1* | 10/2010 | Recker ............... H05B 33/0803 362/20 |
| 2010/0277070 | A1 | 11/2010 | Butteris et al. |
| 2010/0301751 | A1 | 12/2010 | Chobot et al. |
| 2011/0006691 | A1 | 1/2011 | Blaha et al. |
| 2011/0043035 | A1 | 2/2011 | Yamada et al. |
| 2011/0062888 | A1 | 3/2011 | Bondy et al. |
| 2011/0080116 | A1 | 4/2011 | Negley et al. |
| 2011/0109164 | A1 | 5/2011 | Mohammed Suhura et al. |
| 2011/0121654 | A1 | 5/2011 | Recker et al. |
| 2011/0121754 | A1 | 5/2011 | Shteynberg et al. |
| 2011/0140611 | A1 | 6/2011 | Elek et al. |
| 2011/0140612 | A1 | 6/2011 | Mohan et al. |
| 2011/0232143 | A1 | 9/2011 | Hsu |
| 2012/0262093 | A1* | 10/2012 | Recker ............... H05B 33/0854 315/308 |
| 2013/0063027 | A1 | 3/2013 | Recker et al. |
| 2013/0200707 | A1 | 8/2013 | Hartmann et al. |
| 2015/0015145 | A1 | 1/2015 | Carrigan et al. |
| 2015/0021988 | A1 | 1/2015 | Barnetson et al. |
| 2015/0048685 | A1 | 2/2015 | Wilson |
| 2015/0091463 | A1 | 4/2015 | Jin |

FOREIGN PATENT DOCUMENTS

| | | |
|---|---|---|
| WO | WO 2010/139080 A1 | 12/2010 |
| WO | WO 2011/124721 A1 | 10/2011 |
| WO | WO 2012/104800 A2 | 8/2012 |
| WO | WO 2013/124827 | 8/2013 |

OTHER PUBLICATIONS

International Search Report Corresponding to International Application No. PCT/US12/68987; dated Feb. 26, 2013; 14 Pages.
International Search Report and Written Opinion Corresponding to International Application No. PCT/US12/68991; dated Mar. 4, 2013; 10 Pages.
International Search Report and the Written Opinion Corresponding to PCT/US12/68984; dated May 10, 2013; 16 pages.
Notification Concerning Transmitter of the International Preliminary Report on Patentability, PCT/US2012/68991, dated Jun. 26, 2014.
Capacitor-Input Filter, Dec. 12, 2011, http://en.wikipedia.org/w/index.php?title=Capacitor-input_filter&oldid=465397872.
Malvino et al. 2008, Basic Electronics (MSBTE), 3-12 Series Inductor Filter, pp. 94-95, Tata McGraw-Hill Company Limited.
Vishay Intertechnology, Inc., AC Film Capacitors in Connection with Mains, Jan. 7, 2009, pp. 301-303, http://www.eetaiwan.com/STATIC/PDF/200903/20090304_Vishay_AN02.pdf?SOURCES=DOWNLOAD.
Zhu et al. "Novel Capacitor-Isolated Power Converter", pp. 1824-1829, Sep. 2010, Energy Conversion Congress and Exposition (ECCE), 2010 IEEE held in Atlanta, GA.
PCT International Preliminary Report on Patentability issued for corresponding PCT International Application No. PCT/US2013/068910, dated May 28, 2015, 12 pages.
Extended European Search Report Corresponding to European Application No. 12857833.3 dated Nov. 16, 2015; 9 Pages.
Extended European Search Report Corresponding to European Application No. 12858507.2, dated Nov. 30, 2015; 7 Pages.
Johnson, Brant, "Controlling power and cost for multiple LEDs", Texas Instruments, EE Times, Nov. 6, 2006, 4 pages.
Extended European Search Report Corresponding to European Application No. 12857535.4, dated Jul. 7, 2016; 7 Pages.

* cited by examiner

EMERGENCY LIGHTING SYSTEMS AND METHODS FOR SOLID STATE LIGHTING APPARATUS

CROSS REFERENCE TO RELATED APPLICATIONS

The present application claims the benefit of and priority to U.S. Provisional Patent Application No. 61/569,588, filed Dec. 12, 2011, entitled "Emergency Lighting Systems And Methods For Solid State Lighting Apparatus," the disclosure of which is hereby incorporated herein by reference in its entirety.

FIELD

The present application relates to emergency lighting systems, and in particular to emergency lighting systems for solid state apparatus and related methods.

BACKGROUND

Emergency lighting, sometimes referred to as egress lighting, is lighting that is activated in the event of power loss. One purpose of emergency lighting is to allow occupants of a building to safely exit the building in the event of a power outage or other emergency. Emergency lighting is mandated for use in commercial buildings by many electrical codes. Such codes generally specify the amount of light that must be provided in the event of power loss and the duration of time for which such light must be provided. For example, U.S. building codes require emergency lighting to provide one footcandle of light for a minimum of 90 minutes along the path of egress during a power outage.

Emergency lighting fixtures typically have a test button which temporarily overrides the unit and causes it to switch on the lights and operate from battery power even if the main AC line power is still on. Typically, the test button must be manually operated by a technician, and may be held down for the duration of the test.

In buildings, emergency lighting is commonly provided by battery-powered emergency light fixtures that are installed in a building along with the luminaires that provide light in non-emergency situations. In some systems, emergency lights are powered by a central bank of batteries. Building codes generally required the wiring from the central power source to emergency luminaires to be isolated from other electrical wiring.

For fluorescent lighting fixtures, emergency operation may be controlled by an emergency ballast that includes a backup battery. A typical fluorescent emergency lighting fixture is illustrated in FIG. 1. The lighting fixture 10 includes an emergency ballast 12 that includes a backup battery 24. A two-lamp instant start ballast 14 is connected to two fluorescent lamps 16A, 16B. A test switch 18 permits manual activation of the emergency ballast 12.

As is known in the art, fluorescent lamp ballasts stabilize the current through fluorescent lamps, which have a negative resistance characteristic. The ballast provides a positive resistance or reactance that limits the current through the fluorescent lamp to an appropriate level. An instant start ballast, such as the ballast 14, starts the lamps 16A, 16B without heating the cathodes of the lamps by generating a high initial voltage (around 600 V).

A fluorescent emergency lighting system can also be configured so that the emergency ballast 12 serves the function of both providing regular illumination and emergency lighting without the need for a separate lamp ballast.

SUMMARY

Embodiments of the invention include an emergency lighting module for providing emergency power to a solid state luminaire. The emergency lighting module includes a first input configured to receive a DC input voltage from the solid state luminaire, a second input configured to receive a status signal indicative of the status of an AC line voltage, and a first output configured to supply a DC output voltage to the solid state luminaire. The emergency lighting module is configured to supply the DC output voltage to the solid state luminaire in response to a reduction of the AC line voltage.

The signal indicative of the status of the AC line voltage may include an AC line signal and/or a rectified AC line signal.

The emergency lighting module may further include a charging circuit configured to receive the DC input voltage from the solid state luminaire and responsively generate a charging signal for charging a rechargeable battery coupled to the emergency lighting module.

The emergency lighting module may be configured to monitor the DC input voltage to detect a brownout condition of the AC line voltage.

The emergency lighting module may include a second output configured to supply a rectified AC signal to the luminaire.

The emergency lighting module may be configured to supply a control signal to the luminaire that disables an AC/DC converter of the luminaire in response to reduction of the AC line voltage.

The emergency lighting module may be configured to supply a dimming control signal to the luminaire in response to reduction of the AC line voltage.

The dimming control signal may include a pulse width modulation (PWM) control signal.

The emergency lighting module may further include a microcontroller configured to monitor the power status signal and to generate the PWM control signal in response to reduction of the AC line voltage. The microcontroller may be configured to generate the PWM control signal to have a target duty cycle.

The microcontroller may be configured to initially generate the PWM control signal to have a first duty cycle that may be lower than the target duty cycle and to increase the duty cycle of the PWM control signal from the first duty cycle to the target duty cycle. The first duty cycle may be less than about 10%.

The microcontroller may be configured to increase the duty cycle of the PWM control signal from the first duty cycle to the target duty cycle in about 1 to 4 seconds.

The microcontroller may be configured to decrease the duty cycle of the PWM control signal from the target duty cycle to a final duty cycle that is lower than the target duty cycle.

The microcontroller may be configured to decrease the duty cycle of the PWM control signal from the target duty cycle to the final duty cycle over a period of at least 60 minutes. The final duty cycle may be about 60% of the target duty cycle.

The microcontroller may be configured to maintain the duty cycle of the PWM control signal at the final duty cycle until the AC line voltage may be restored or until battery capacity may be exceeded.

The emergency lighting module may further include an AC detector configured to detect a presence of the AC line voltage and to supply an AC detection signal to the microcontroller in response to presence of the AC line voltage.

The emergency lighting module may further include an analog to digital converter configured to receive the DC input voltage and provide a digital signal indicative of a voltage level of the DC input voltage to the microcontroller.

The emergency lighting module may further include a charging circuit coupled to the microcontroller. The charging circuit may be configured to receive the DC input voltage from the solid state luminaire and to receive a charging control signal from the microcontroller, and responsively generate a charging signal for charging a rechargeable battery coupled to the emergency lighting module. The module may further include a voltage booster circuit coupled to the microcontroller and configured to receive a voltage booster control signal from the microcontroller and a DC battery voltage from the rechargeable battery and responsively generate the DC output voltage that may be supplied to the solid state luminaire.

The microcontroller may be configured to cause the voltage booster circuit to generate the DC output voltage in response to reduction of the AC line voltage.

The microcontroller may be configured to cause the voltage booster circuit to generate the DC output voltage to have a voltage level that increases from a first voltage level to a maximum voltage level at a first ramping speed in response to reduction of the AC line voltage. The first ramping speed may be between about 1 to 40 V/s. The first voltage level may be zero volts.

The microcontroller may be configured to cause the voltage booster circuit to generate the DC output voltage to have a voltage level that decreases from the maximum voltage level to zero volts at a second ramping speed in response to restoration of the AC line voltage.

The emergency lighting module may be configured to ramp the DC output voltage up from an initial voltage level to a target voltage level in response to detecting reduction of the AC line signal. The initial voltage level may be zero volts.

The emergency lighting module may be configured to ramp the DC output voltage up from the initial voltage level to the target voltage level at a ramping speed that may be between about 1 and 40 V/s.

The emergency lighting module may be configured to ramp the DC output voltage down from the target voltage level to zero volts in response to detecting restoration of the AC line signal.

An emergency lighting module for providing emergency power to a solid state luminaire includes a microcontroller, an AC detector coupled to the microcontroller and configured to detect a presence of an AC line signal, a first input configured to receive a DC input voltage from the solid state luminaire, a battery charger coupled to the microcontroller and configured to charge a battery using the DC input voltage in response to a first control signal from the microcontroller, and a voltage booster coupled to the microcontroller and configured to generate a DC output signal in response to a battery voltage and a second control signal from the microcontroller. The emergency lighting module is configured to supply the DC output to the solid state luminaire in response to a reduction of the AC line voltage.

The emergency lighting module may be configured to supply a dimming control signal to the luminaire in response to reduction of the AC line voltage. The dimming control signal may include a pulse width modulation (PWM) control signal.

The emergency lighting module may further include a microcontroller configured to monitor the power status signal and to generate the PWM control signal in response to reduction of the AC line voltage.

The microcontroller may be configured to generate the PWM control signal to have a target duty cycle.

The microcontroller may be configured to initially generate the PWM control signal to have a first duty cycle that may be lower than the target duty cycle and to increase the duty cycle of the PWM control signal from the first duty cycle to the target duty cycle. The first duty cycle may be less than about 10%. The microcontroller may be configured to increase the duty cycle of the PWM control signal from the first duty cycle to the target duty cycle in about 1 to 4 seconds.

The microcontroller may be configured to decrease the duty cycle of the PWM control signal from the target duty cycle to a final duty cycle that may be lower than the target duty cycle.

The microcontroller may be configured to decrease the duty cycle of the PWM control signal from the target duty cycle to the final duty cycle over a period of at least 60 minutes. The final duty cycle may be about 60% of the target duty cycle.

The microcontroller may be configured to maintain the duty cycle of the PWM control signal at the final duty cycle until the AC line voltage may be restored.

An emergency lighting module for providing emergency power to a solid state luminaire according to further embodiments includes a microcontroller and an AC detector coupled to the microcontroller and configured to detect a presence of an AC line signal. The emergency lighting module is configured to supply a dimming control signal to the luminaire in response to reduction of the AC line voltage.

The dimming control signal may include a pulse width modulation (PWM) control signal.

The emergency lighting module may further include a microcontroller configured to monitor the power status signal and to generate the PWM control signal in response to reduction of the AC line voltage.

The microcontroller may be configured to generate the PWM control signal to have a target duty cycle.

The microcontroller may be configured to initially generate the PWM control signal to have a first duty cycle that may be lower than the target duty cycle and to increase the duty cycle of the PWM control signal from the first duty cycle to the target duty cycle. The first duty cycle may be less than about 10%.

The microcontroller may be configured to increase the duty cycle of the PWM control signal from the first duty cycle to the target duty cycle in about 1 to 4 seconds.

The microcontroller may be configured to decrease the duty cycle of the PWM control signal from the target duty cycle to a final duty cycle that may be lower than the target duty cycle.

The microcontroller may be configured to decrease the duty cycle of the PWM control signal from the target duty cycle to the final duty cycle over a period of at least 60 minutes. The final duty cycle may be about 60% of the target duty cycle.

The microcontroller may be configured to maintain the duty cycle of the PWM control signal at the final duty cycle until the AC line voltage may be restored.

The microcontroller may be configured to receive a module identification signal from the luminaire and to generate the dimming control signal in response to the module identification signal. The module identification signal may include a digital signal and/or an analog signal.

The microcontroller may be configured to receive a battery identification signal from a battery. The microcontroller may be configured to generate the dimming control signal in response to the battery identification signal. The microcontroller may be configured to control charging of the battery in response to the battery identification signal. The battery identification signal may include a digital signal and/or an analog signal.

A method of operating an emergency lighting module for providing emergency power to a solid state luminaire includes monitoring an AC line voltage, generating a DC voltage in response to reduction of the AC line voltage, and supplying the DC voltage to the solid state luminaire in response to reduction of the AC line voltage.

The method further includes generating a dimming control signal and supplying the dimming control signal to the solid state luminaire in response to reduction of the AC line voltage. The dimming control signal may include a pulse width modulation (PWM) signal. The method may further include generating the PWM control signal to have a target duty cycle.

The method may further include initially generating the PWM control signal to have a first duty cycle that may be lower than the target duty cycle and increasing the duty cycle of the PWM control signal from the first duty cycle to the target duty cycle. The first duty cycle may be less than about 10%.

The method may further include increasing the duty cycle of the PWM control signal from the first duty cycle to the target duty cycle in about 1 to 4 seconds.

The method may further include decreasing the duty cycle of the PWM control signal from the target duty cycle to a final duty cycle that may be lower than the target duty cycle.

The method may further include decreasing the duty cycle of the PWM control signal from the target duty cycle to the final duty cycle over a period of at least 60 minutes. The final duty cycle may be about 60% of the target duty cycle.

The method may further include maintaining the duty cycle of the PWM control signal at the final duty cycle until the AC line voltage may be restored.

A method of testing a solid state luminaire including a test switch using an emergency lighting module including a battery includes monitoring the test switch for actuation, in response to actuation of the test switch, determining if the test switch was actuated for more than a threshold time, in response to the actuation of the test switch for more than the threshold of time, operating the solid state luminaire on battery power for a test period in excess of one hour without requiring continued actuation of the test switch during the test period, and supplying a dimming signal to the solid state luminaire during the test period. The dimming signal may cause the solid state luminaire to become more dim over a duration of the test period.

The dimming control signal may include a pulse width modulation (PWM) signal. The method may further include generating the PWM control signal to have a target duty cycle.

The method may further include initially generating the PWM control signal to have a first duty cycle that may be lower than the target duty cycle and increasing the duty cycle of the PWM control signal from the first duty cycle to the target duty cycle. The first duty cycle may be less than about 10%. The method may further include increasing the duty cycle of the PWM control signal from the first duty cycle to the target duty cycle in about 1 to 4 seconds.

The method may further include decreasing the duty cycle of the PWM control signal from the target duty cycle to a final duty cycle that may be lower than the target duty cycle.

The method may further include decreasing the duty cycle of the PWM control signal from the target duty cycle to the final duty cycle over a period of at least 60 minutes. The final duty cycle may be about 60% of the target duty cycle.

The method may further include in response to actuation of the test switch, checking a charge level of the battery, and in response to the charge level of the battery being less than a threshold charge level, ignoring the test switch actuation.

The method may further include in response to the actuation of the test switch for less than the threshold of time, operating the solid state luminaire on battery power for a shortened test period.

An emergency lighting module for providing emergency power to a solid state luminaire includes a microcontroller, and an AC detector coupled to the microcontroller and configured to detect a presence of an AC line signal. The emergency lighting module is configured to supply a DC voltage and a dimming control signal to the luminaire in response to reduction of the AC line voltage. The module further includes a test switch coupled to the microcontroller. The microcontroller is configured to test operation of the emergency lighting controller in response to actuation of the test switch. The module further includes a wireless interface coupled to the test switch and configured to enable wireless actuation of the test switch.

The wireless interface may include a visible light detector that may be configured to actuate the test switch in response to a visible light signal, an infrared signal, a bluetooth signal, and/or a WIFI signal.

Other systems, methods, and/or computer program products according to embodiments of the invention will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Recently, solid state luminaires that use light emitting diodes (LEDs) as light sources instead of fluorescent bulbs have been developed for general illumination. Accordingly, there is a need for emergency lighting systems that are suitable for driving an LED load.

Figure 1:
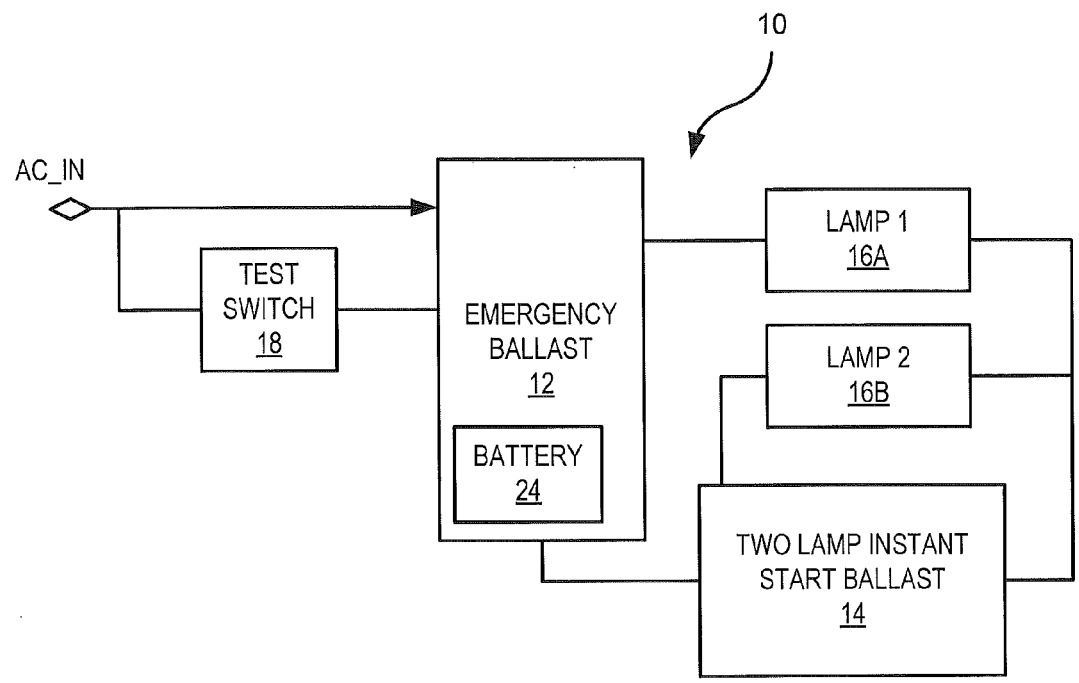
FIG. 1 is a schematic diagram of a conventional fluorescent lighting fixture with an emergency lighting ballast.
Figure 2:
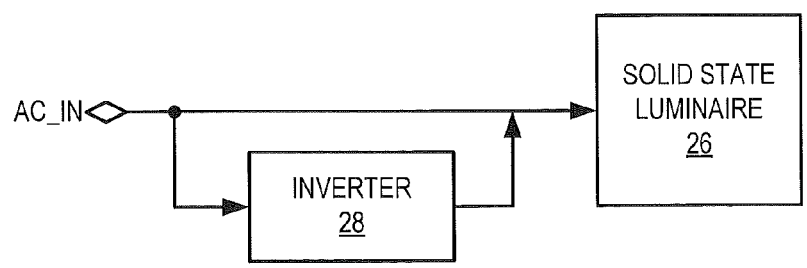
FIG. 2 is a schematic diagram of a solid state luminaire coupled to a power inverter.

Conventionally, emergency lighting for solid state luminaires has been handled through the use of a battery powered inverter connected to the luminaire. For example, as shown in FIG. 2, an inverter 28 is coupled to a solid state luminaire 26. The inverter includes a battery (not shown) that is charged by power received from an AC input (AC_IN) that also normally powers the luminaire 26. As is known in the art, an inverter generates a sine wave or quasi-sine wave AC output in response to a DC power signal, such as a DC signal generated by a battery. The inverter 28 monitors the input voltage AC_IN and supplies an AC signal to the luminaire 26 in the event the AC_IN voltage is removed. One drawback of this type of system is that the solid state luminaire 26 is unaware of the power outage, and will continue to run at its full lumen level. Thus, in order to meet applicable code requirements, the inverter must be capable of supplying enough power to run the luminaire 26 at its full lumen output level for the entire time period required by code. This undesirably increases the capacity requirements, and therefore the cost, of the battery.

Figure 3:
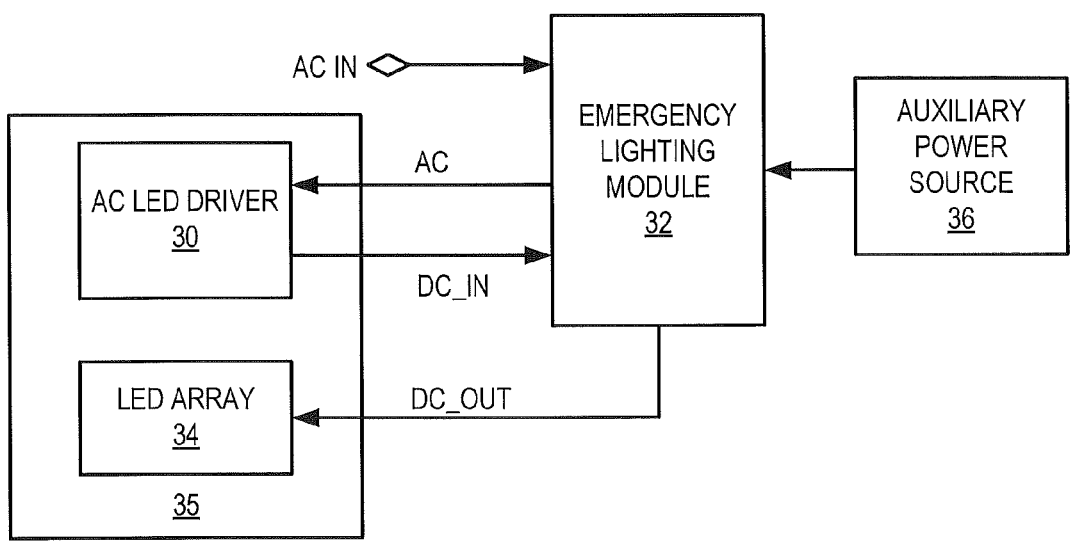
FIG. 3 is a schematic diagram of an emergency lighting module for a solid state luminaire according to some embodiments.

Embodiments of the present invention provide an emergency lighting module that provides DC power to a solid state luminaire and that controls operation of the luminaire in an emergency lighting mode. Some embodiments may also control dimming of the luminaire in a non-emergency mode. Referring to FIG. 3, an emergency lighting module 32 provides emergency power to a solid state luminaire 35. The emergency lighting module 32 connects directly to the LED array 34 of the luminaire 35 as well to an AC LED driver 30, and provides a DC voltage signal DC_OUT to the LED array 34. It will be appreciated that the emergency lighting module 32 and/or the AC LED driver 30 may be provided together with the LED array 34 as an integral part of an LED display or as separate components. Moreover, the LED array 34 may have any desired configuration and/or number of LEDs, including only a single LED.

In normal operation, an LED driver provides DC current to an LED array. As power is typically supplied via AC lines, it must be converted to DC. Referring to FIG. 3, AC power is supplied via the AC_IN line. The AC power is passed to the AC LED driver 30, which generates a DC drive signal DC_IN that is passed to the LED array 34 through the emergency LED driver 32 over the DC_OUT line.

When the AC power supplied over the AC_IN input is interrupted, DC power is drawn from an auxiliary source 36, which may be a rechargeable battery pack, and passed to the LED array 34 over the DC_OUT line.

This configuration is an improvement over the configuration shown in FIG. 2 that uses an inverter to supply emergency AC power, as the emergency lighting module 32 can directly drive the LEDs with DC power at a lower current in the event of a power outage. However, in such a configuration, the emergency LED driver current is set at a fixed level. Thus, the lumen output of the luminaire 35 may vary depending on the configuration of the particular luminaire that the emergency module 32 is paired with. For example, if the luminaire 35 has 10 LEDs with a drive current of 1 amp, the lumen level output by the luminaire 35 during emergency operation will be different than the lumen output of a luminaire that has 10 LEDs with a drive current of 750 milliamps, because both luminaires would be run at the same reduced load current in emergency operation.

Some embodiments of the present invention provide digitally controlled emergency lighting modules (ELMs). Digital control may be accomplished by means of a microcontroller, a microprocessor, a field programmable gate array, or other suitable digital circuitry. The term "microcontroller" is used herein to refer to any suitably configured digital control circuitry. Microcontrollers are commonly employed in LED lighting systems for dimming control via remote communications. Some embodiments of the present invention provide a microcontroller based emergency lighting module for solid state luminaires in which a microcontroller performs emergency monitoring and control functions in addition to dimming control.

In an emergency lighting module according to some embodiments, the microcontroller and its firmware can provide comprehensive system monitoring and control functionality. Several semi-autonomous control systems/algorithms may be merged together to implement the system requirements.

Inclusion of a microcontroller in and emergency lighting module (with its accompanying input/output, peripherals, and firmware-based algorithms) allows for more sophisticated and integrated control than would otherwise be practical.

With a microcontroller and its associated input/output (I/O) capability and design flexibility, an emergency lighting module according to some embodiments may have the capability of handling multiple feature sets and technologies within the same product.

Figure 4:
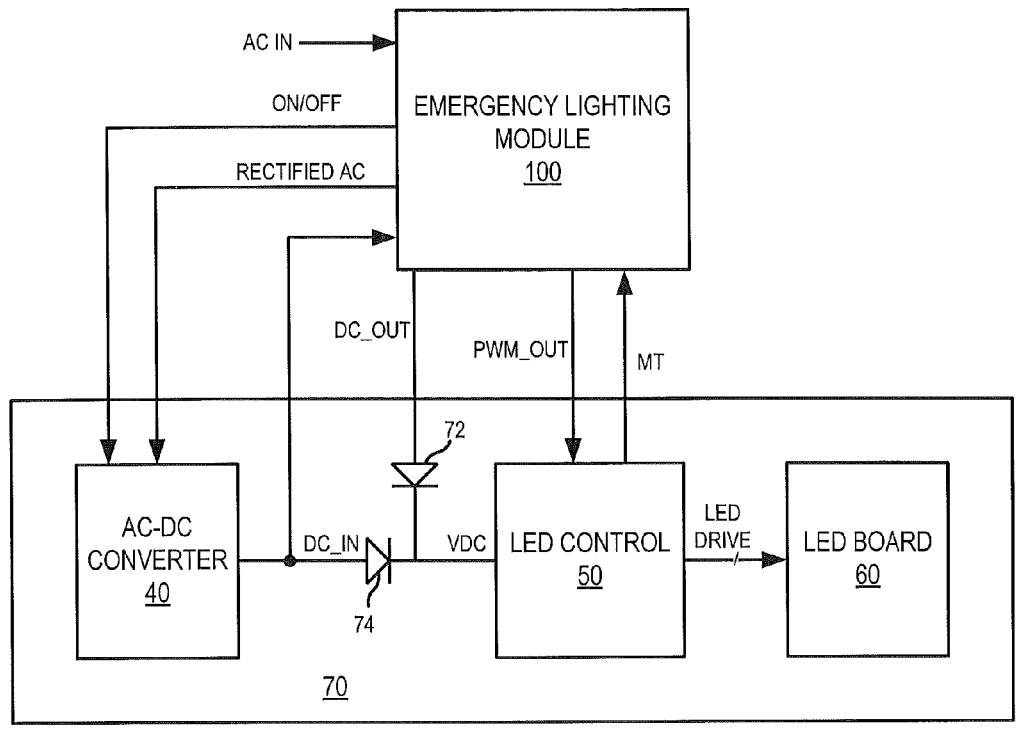
FIGS. 4 and 5 are schematic diagrams of emergency lighting modules for solid state luminaires according to further embodiments.
Figure 5:
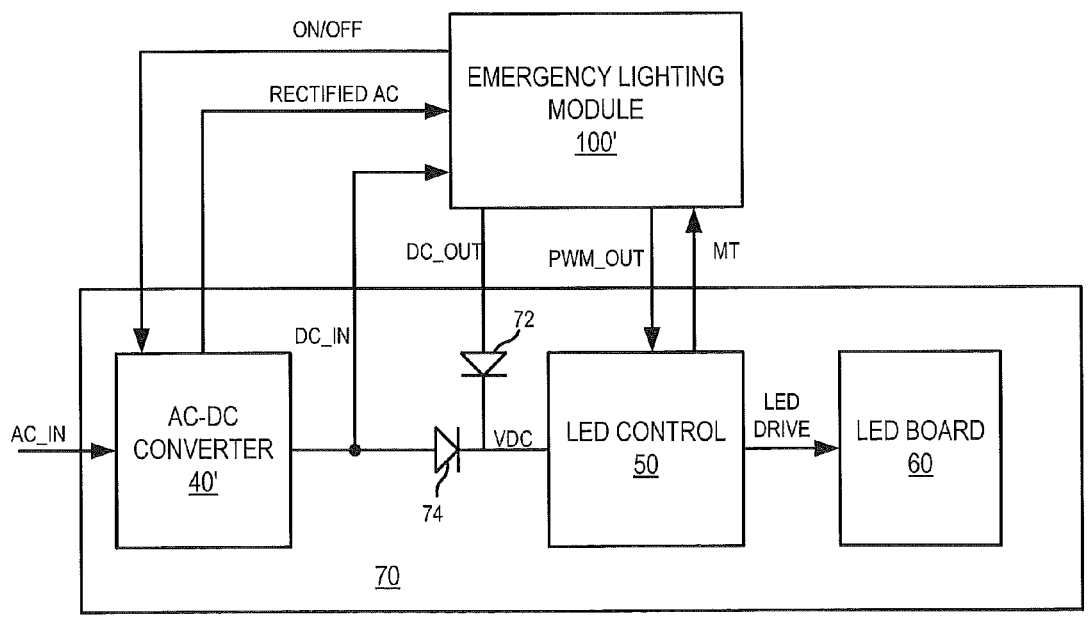

Emergency lighting modules according to embodiments of the invention are illustrated in FIGS. 4 and 5. Referring to FIGS. 4 and 5, an emergency lighting module 100, 100' is connected to and provides emergency power to a solid state luminaire 70. The solid state luminaire 70 includes an AC/DC converter 40, 40' an LED control module 50 and an LED board 60.

The AC/DC converter 40 of FIG. 4 receives a rectified AC signal and responsively generates a DC output signal DC_IN. The AC/DC converter 40' of FIG. 5 receives a power line AC input signal, which may, for example, be an AC signal at 120 or 220 volts, and responsively generates a DC output signal while passing the AC input signal on to the emergency lighting module 100. The DC output signal of the AC-DC converter 40, 40' is provided to an LED control module 50. The LED control module 50 performs DC/DC conversion to generate a DC signal that is configured to drive LEDs in the LED board 60 at a desired level. The LED control module 50 may control the brightness and/or hue of light emitted by the LED board 60 by controlling the voltage and/or current supplied to various LEDs or groups or strings of LEDs in the LED board 60 via the LED DRIVE input to the LED board 60.

The LED board 60 may include single and/or multiple strings of white, red, blue, green and/or blue-shifted yellow (BSY) LEDs as described for example in U.S. Pat. No. 7,213,940 and U.S. Pat. No. 8,029,155 the disclosures of which are incorporated by reference in their entirety.

Figure 6:
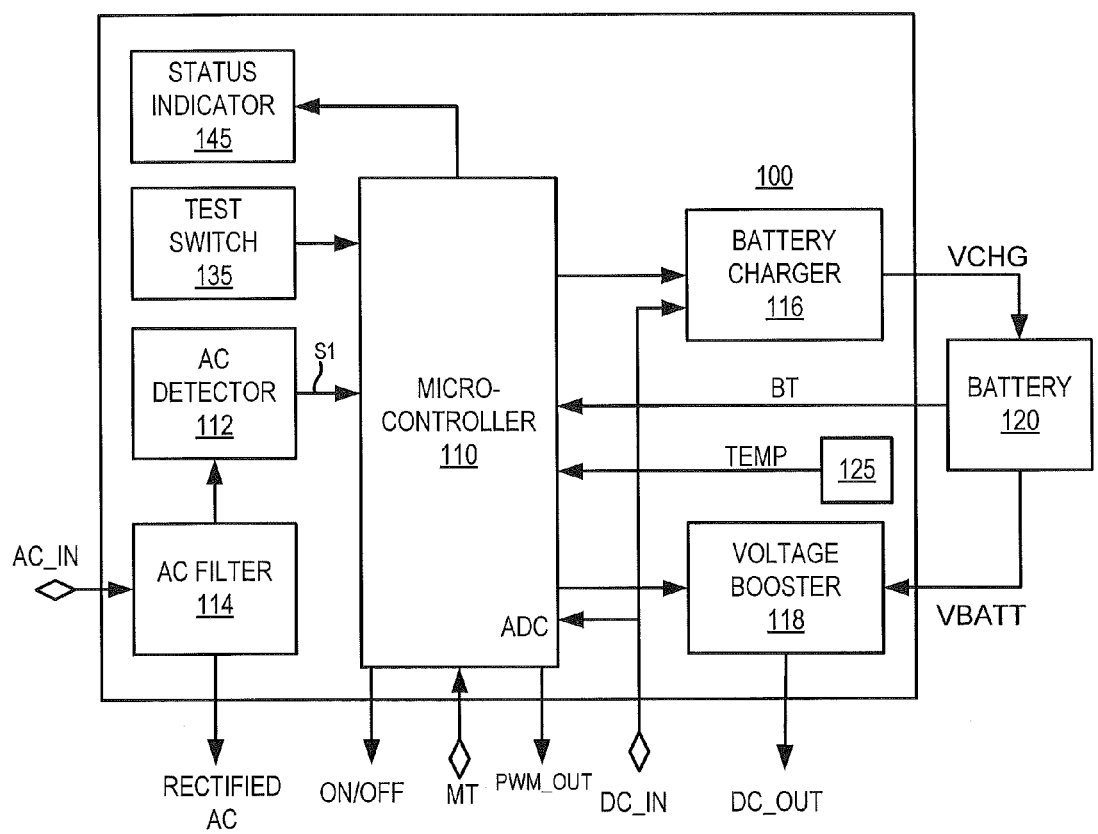
FIGS. 6 and 7 are detailed schematic diagrams of emergency lighting modules according to some embodiments.

Referring to FIG. 4, the emergency lighting module 100 receives an AC line voltage signal AC_IN and responsively generates a rectified AC signal, which is provided to the AC/DC converter 40. The emergency lighting module 100 also receives the DC_IN signal from the AC/DC converter 40, which is used to charge a backup battery 120 (FIG. 6). The emergency lighting module 100 further generates an ON/OFF control signal and a pulse width modulation (PWM) dimming signal PWM_OUT, which are applied to the LED control module 50 to control the operation thereof. The emergency lighting module 100 is also configured to generate a DC_OUT signal that is used to drive the LED control module 50 when the AC input signal is lost.

The DC_OUT signal generated by the emergency lighting module 100 and the DC_IN signal generated by the AC/DC converter 40, 40' are logic OR'ed by diodes 72, 74 before being applied to the LED control module 50. Accordingly, a higher of the voltages DC_IN, DC_OUT is applied to the LED control module 50. This also prevents the back feed of DC_IN to DC_OUT or DC_OUT to DC_IN.

The emergency lighting module 100 also receives a module type signal MT that indicates the type and/or identity of the luminaire 70 to which the emergency lighting module 100 is attached. The emergency lighting module 100 may use the module type information to determine how much the luminaire 70 should be dimmed during emergency operation to meet minimum luminescent requirements for emergency lighting, as discussed in more detail below.

Referring to FIG. 5, the emergency lighting module 100' receives an AC signal from the AC/DC converter 40' and a DC_IN signal from the AC/DC converter 40'. The emergency lighting module 100 further generates ON/OFF control and PWM_OUT dimming signals, which are applied to the LED control module 50. The emergency lighting module 100 is also configured to generate a DC_OUT signal that is used to drive the LED control module 50 when the AC input signal is lost.

An emergency lighting module 100 according to some embodiments is illustrated in more detail in FIG. 6. As shown therein, the emergency lighting module 100 includes a microcontroller 110 that controls operations of the emergency lighting module 100.

The microcontroller 110 may include, but is not limited to, a programmable microcontroller, microprocessor, field programmable gate array, or other suitable circuitry. In particular, the microcontroller 110 may be a general purpose programmable microcontroller, such as a model MSP430 microcontroller manufactured by Texas Instruments.

A conventional AC filter 114 filters and rectifies an AC line voltage AC_IN. The rectified AC signal is output by the AC filter 114. An AC detector 112 is coupled to the AC filter 114 and detects the presence or absence of an AC input signal to the AC filter 114. An output of the AC detector 112 is provided to the microcontroller 110.

Figure 22:
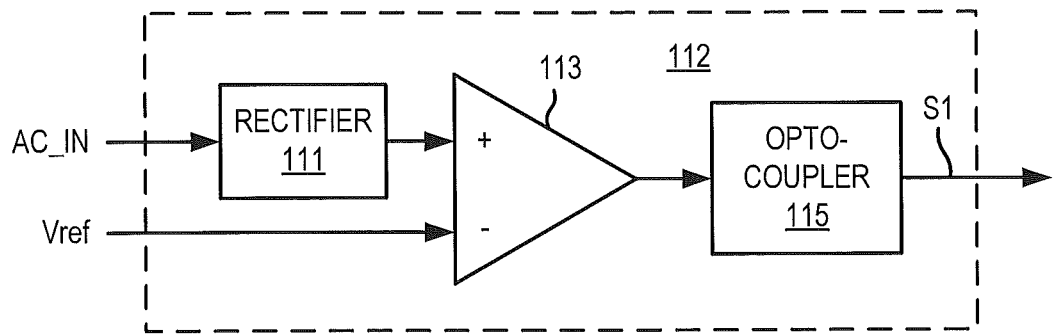
FIG. 22 is a block diagram of an AC detector according to some embodiments.

Brief reference is made to FIG. 22, which illustrates an AC detector 112 according to some embodiments in more detail. As shown therein, the AC detector may include a rectifier circuit 111 having an input coupled to the AC filter 114 and an output coupled to a comparator 113 that drives an opto-coupler 115 for providing a signal Si that is indicative of the AC line voltage. The opto-coupler 115 output will pulse at the line frequency rate as long as the AC voltage magnitude is above a predetermined cutoff level Vref. When the AC voltage drops below the cutoff level, the comparator 113 output becomes static, and no further pulses are generated through the opto-coupler 115. The microcontroller 110 monitors the opto-coupler output signal for activity. If the opto-coupler output stops producing transitions at the line frequency, the microcontroller 110 may detect this as a loss of AC signal.

Referring again to FIG. 6, the microcontroller 110 is also coupled to a battery charger 116 and a voltage booster 118, and controls operations thereof. A DC input is provided to the battery charger 116, while a DC output voltage DC_OUT is provided by the voltage booster 118. The volatile and non-volatile memory requirements for the microcontroller 110 may be fulfilled with internal and/or external circuitry. The digital controller may use internal and/or external devices to convert analog and digital input/output signals.

A battery 120 is coupled to the microcontroller 110, the battery charger 116 and the voltage booster 118. The battery 120 may be a rechargeable battery, which may in some embodiments include a lithium-iron-phosphate (LiFePO$_4$) rechargeable battery cell. Other types of battery technologies may be use, including, without limitation, NiCd, NiMH, lead-acid, etc. The battery 120 may be provided externally to the emergency lighting module 100 as illustrated in FIG. 4, or may be integrated within the emergency lighting module 100.

The battery 120 provides a battery type signal BT that indicates the type of battery that is connected to the emergency lighting module 100. The microcontroller 110 may use this information to determine the battery type, voltage and/or capacity (e.g., in milliamp-hours) of the battery 120.

The battery 120 and/or the emergency lighting module 100 may include a temperature sensor 125 that provides a temperature signal TEMP that is representative of the temperature of the battery 120 to the microcontroller 110. The temperature of the battery 120 may be used by the microcontroller to improve the safety of the battery packs and also to improve charging performance. Using the temperature information it may be possible for the microcontroller 110 to tailor charging and discharging functions to increase efficiency for a given temperature. The microcontroller 110 may also disable the battery pack 120 in response to a temperature sensed by the temperature sensor 125 in the event of a malfunction.

Figure 23:
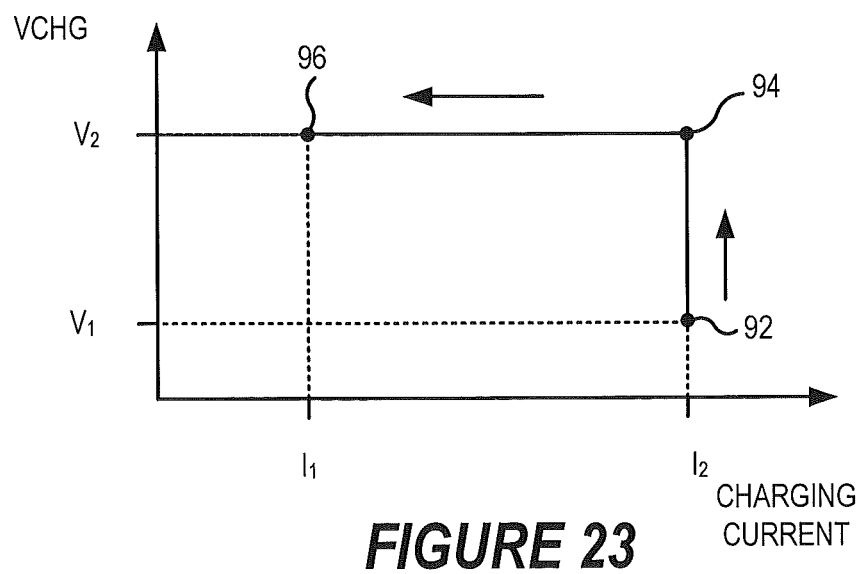
FIG. 23 is a graph of charging voltage versus charging current for a rechargeable backup battery for an emergency lighting module in accordance with some embodiments.

An exemplary charging algorithm is illustrated in FIG. 23, which is a graph of charging voltage versus charging current. Assuming a discharged battery has a discharged voltage level of V1, the battery is charged by applying a constant current I2 to the battery. In response to the charging current, the battery voltage may rise from V1 to V2 while the charging current is held constant. Once the battery voltage reaches a charged voltage level of V2, the battery voltage is held constant, while the charging current is reduced from I2 to I1.

The values of I2, I2, V1 and V2 may be determined or selected in response to a temperature sensed by the temperature sensor 125. The determination may be made, for example, using a formula, a lookup table, etc. In particular embodiments, the values of I2 and I2 may be reduced when a high temperature is detected and increased when a low temperature is detected. Moreover, charging could be suspended if a temperature higher than a threshold temperature is detected. After a temperature based shutoff, charging may be retried after waiting a predefined period of time and/or waiting until the sensed temperature falls below a second threshold level.

Referring again to FIG. 6, the microcontroller 110 has an input for a test switch and an output for battery status. The microcontroller 110 also generates the ON/OFF control and PWM_OUT dimming signals described above.

The microcontroller 110 is configured to monitor the status of the AC detector 112, and, in response to a detected loss of AC input power, cause the voltage booster 118 to generate a DC output voltage DC_OUT to be supplied to the LED control module 50. The microcontroller 110 also controls the level of light output by the solid state luminaire 70 by means of a PWM_OUT dimming signal.

Figure 7:
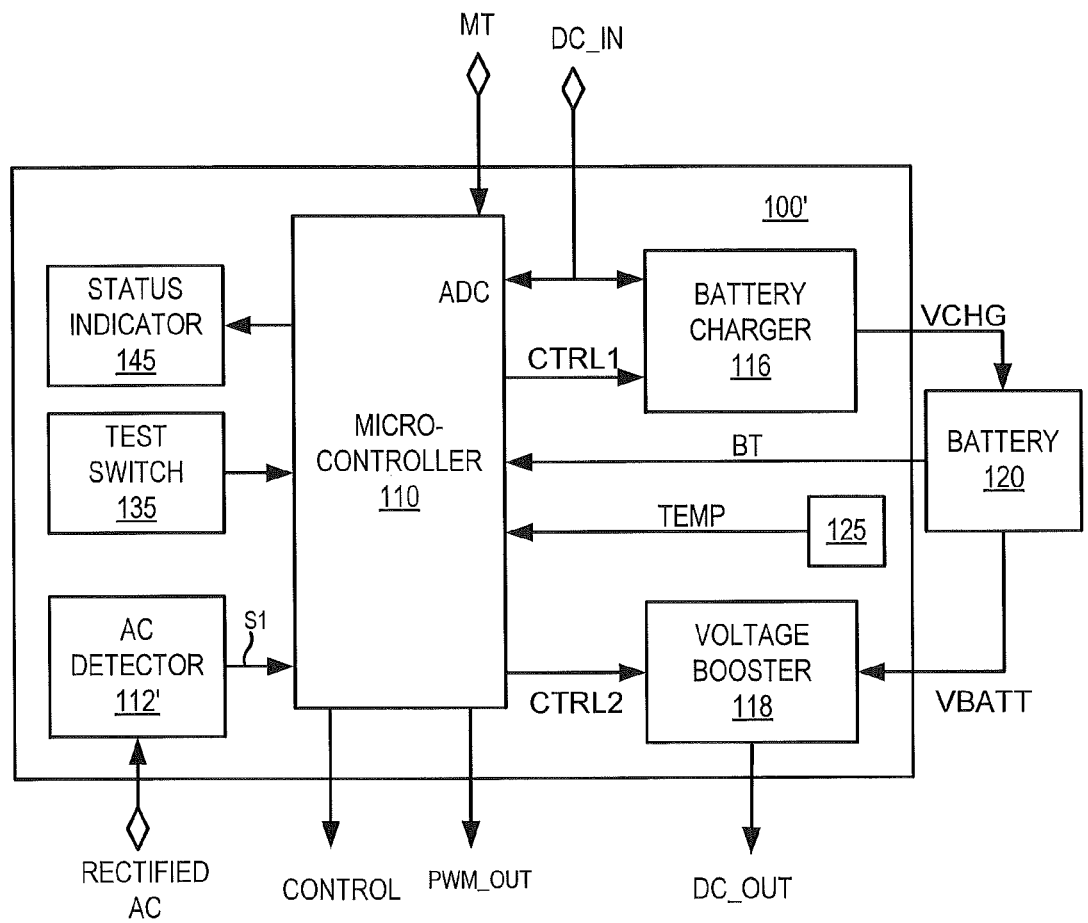

An emergency lighting module 100' according to some embodiments is illustrated in more detail in FIG. 7. The emergency lighting module 100' shown in FIG. 7 is similar to the emergency lighting module 100 shown in FIG. 6, except that the emergency lighting module 100' includes an AC detector 112' that receives a rectified AC signal and responsively generates a signal indicative of the status of the AC power supply, which is provided to the microcontroller 110.

As noted above, the AC/DC converter 40, 40' in the luminaire 70 (FIG. 4-5) converts AC voltage to a DC voltage which is delivered to the DC/DC LED control module 50. The LED control module 50 converts the DC input voltage to a controlled and regulated current for driving single or multiple LED strings in the LED board 60.

In the configuration illustrated in FIG. 7, the emergency lighting module 100' receives an AC signal as an input. The AC signal is monitored for indication of loss of AC power for transition to backup operation and for charging the battery 120. The microcontroller 110 detects the absence of an AC signal and in response transitions to emergency lighting mode. When emergency lighting mode is entered, the microcontroller 110 shuts off the AC/DC converter 40 via the ON/OFF control signal and delivers a pulse width modulated signal PWM_OUT to the LED control module 50 which determines the lumen level output by the fixture in an emergency mode. The microcontroller 110 also causes the voltage booster 118 to deliver a DC voltage DC_OUT to the LED control module 50. This level of integration allows the reuse of existing electronics on the luminaire 70, such as the DC/DC circuitry in the LED control module 50 and the AC/DC rectifiers in the AC/DC converter 40. That is, only a single AC/DC converter and a single DC/DC LED control circuit may be needed between the emergency lighting controller 100 and the luminaire 70.

Some existing fluorescent and LED emergency fixtures include a detection circuit that senses brown out conditions (as opposed to complete power loss conditions) that may cause a luminaire to go out even though the AC power has not completely gone away. It may be desirable for the emergency lighting to engage during brownout conditions to keep the light output at minimum levels.

According to some embodiments, the microcontroller 110 can monitor the secondary side DC voltage (DC_IN signal in FIGS. 4 and 5) that powers the LED strings. When this voltage begins to dip (indicating a potential brown-out condition), the digital controller can switch to emergency mode to ensure light output during brown outs that may cause other non-emergency LED lights to go out. Accordingly, as illustrated in FIGS. 6 and 7, the DC_IN signal may be provided to an analog to digital converter input ADC of the microcontroller 110, which allows the microcontroller 110 to monitor the level of the DC_IN voltage generated by the AC/DC converter 40.

Figure 8:
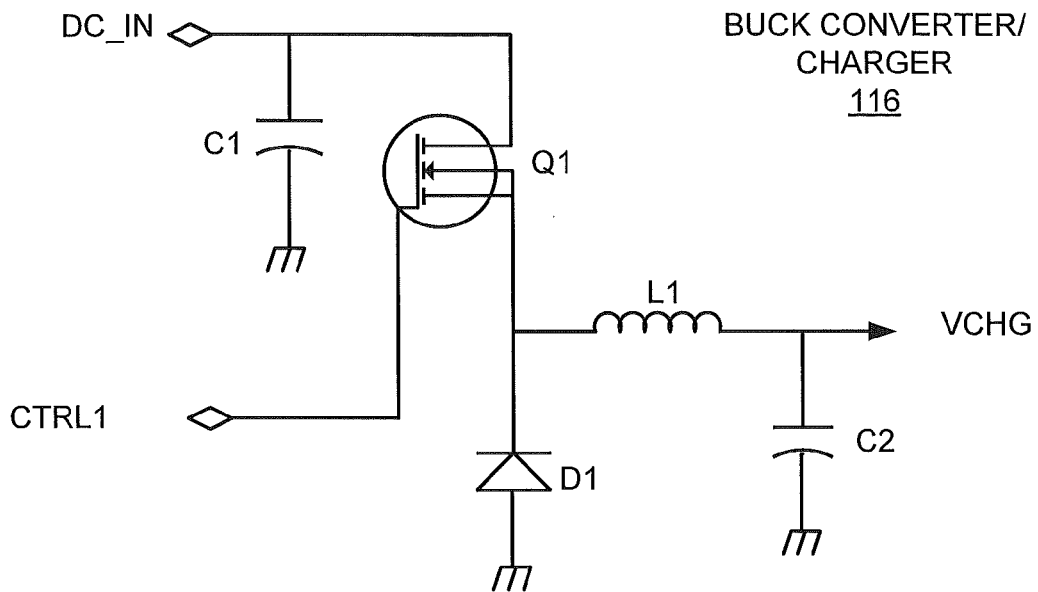
FIG. 8 is a circuit diagram of a buck converter for an emergency lighting module according to some embodiments.

The battery charger 116 may be implemented as a buck converter as illustrated, for example, in FIG. 8. As shown therein, the battery charger 116 may include input and output capacitors C1, C2, a transistor Q1, which may be a N-channel enhancement mode MOSFET, a diode rectifier D1 and an inductor L1. It will be appreciated that the transistor Q1 could be any type of suitably configured current or voltage controlled switch, such as p-channel MOSFETs, bipolar junction transistors, etc. An input voltage DC_IN is drawn from the AC/DC converter 40, 40' of the luminaire 70, as illustrated in FIGS. 4 and 5. An output voltage VCHG is provided to the battery 120. The voltage generated by the AC/DC converter 40, 40' of the luminaire 70 is typically much higher than the voltage needed to charge the battery 120. Accordingly, the battery charger 116 steps the voltage down to provide a desired voltage level VCHG for charging the battery 120.

The operation of a buck converter is well known. Referring again to FIG. 8, the transistor Q1 is operated as a switch under control of the microcontroller 110, which monitors the output current and voltage of the battery charger 116 and responsively controls the ON/OFF state of the transistor Q1 through a control signal CTRL1 applied to the gate of the transistor Q1. By controlling the ON/OFF state of the transistor Q1, the buck charger circuit alternates between connecting the inductor L1 to the source voltage DC_IN to store energy in the inductor L1 when the transistor Q1 is in the ON (conductive) state, and discharging the inductor L1 into the output capacitor C2 (using current drawn through the rectifying diode D1) when the transistor Q1 is in the OFF (nonconductive) state. By measuring the output voltage VCHG, the microcontroller 110 can control the switch Q1 to have a duty cycle that maintains a constant output voltage on the output capacitor C2. As is well known in the art, "duty cycle" of a pulse train refers to the ratio of the pulse duration to the pulse period.

Conversely, during emergency operation, it is necessary to boost the output voltage VBATT provided by the battery 120 so that it can be used by the luminaire to drive the LED control module 50. The voltage generated by the battery VBATT must therefore be boosted to the same voltage level that would otherwise be provided by the AC/DC converter 40, 40' of the luminaire before it can be output as a DC_OUT voltage signal.

Figure 9:
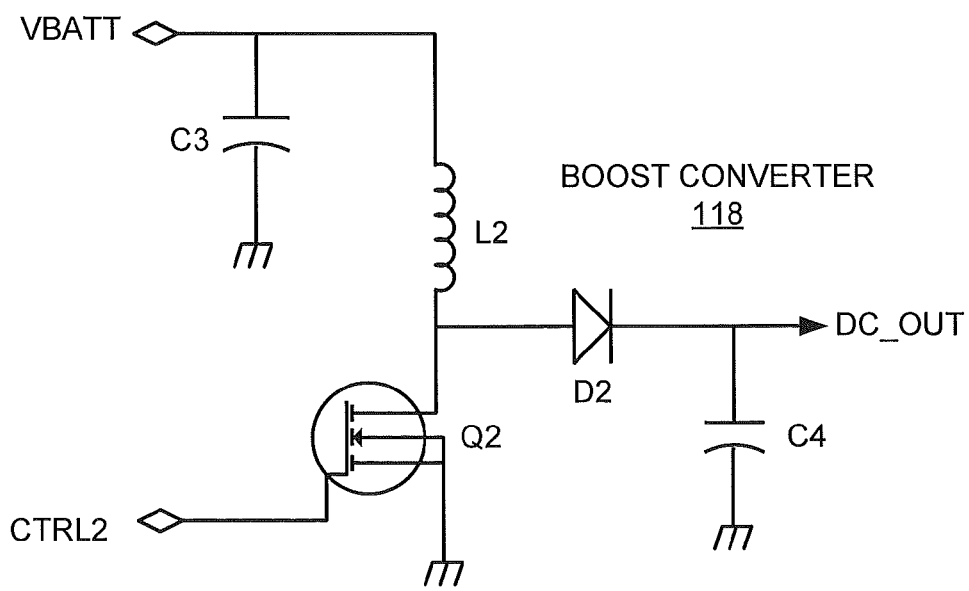
FIG. 9 is a circuit diagram of a boost converter for an emergency lighting module according to some embodiments.

Accordingly, the voltage booster 118 may be implemented as a boost converter as shown in FIG. 9. A boost converter is a DC/DC converter that boosts an input voltage to a higher voltage level. Referring to FIG. 9, the voltage booster 118 may include an input capacitor C3, an output capacitor C4, a transistor switch Q2, which may be an N-channel enhancement mode MOSFET, a diode D2 and an inductor L2. It will be appreciated that the transistor Q2 could be any type of suitably configured current or voltage controlled switch, such as p-channel MOSFETs, bipolar junction transistors, etc.

An input voltage VBATT is provided from the battery 120, and the boost converter generates an output voltage DC_OUT that is provided to the LED control module 50, as shown in FIGS. 4 and 5.

The state of the transistor switch Q2 is controlled by the microcontroller 110 via a gate control signal CTRL2 applied to the gate of the transistor Q2.

By controlling the ON/OFF state of the transistor Q2, the boost converter 118 causes the charge on the output capacitor C4 to increase to a higher level than the input voltage VBATT due to the tendency of the inductor L2 to resist changes in current. When the transistor Q2 is in the ON (conductive) state, current through the inductor increases rapidly, causing the inductor L2 to absorb energy, which is stored in the magnetic field of the inductor. When the transistor Q2 is switched to an OFF (nonconductive) state, the inductor L2 discharges stored energy through the diode D2 and into the output capacitor C4. The voltage generated by the inductor L2 during the discharge phase is related to the rate of change of current, and not to the original charging voltage, thus allowing the output voltage DC_OUT that is stored on the output capacitor C4 to exceed the input voltage VBATT.

By monitoring the output voltage DC_OUT, the microcontroller 110 can control the transistor Q2 to have a duty cycle that causes the output voltage DC_OUT to remain at a desired voltage level.

Figure 10:
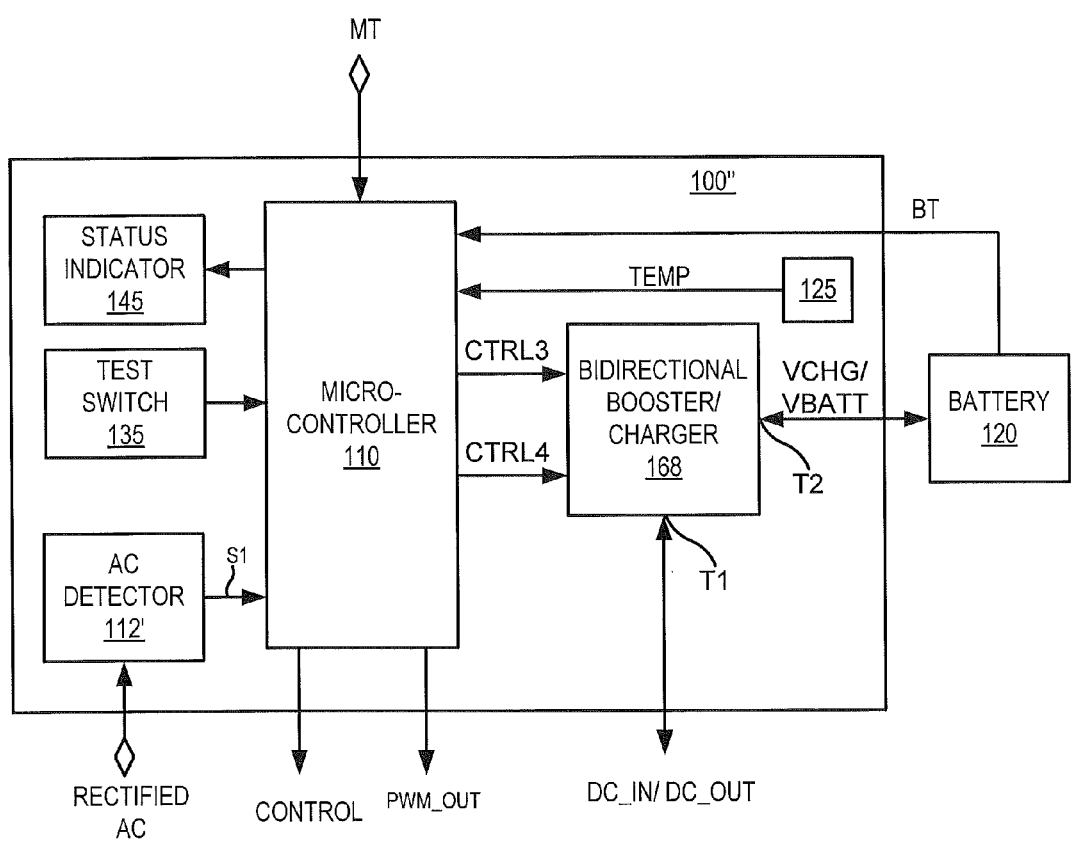
FIG. 10 is a detailed schematic diagram of an emergency lighting module according to further embodiments.

Referring to FIG. 10, in some embodiments, the boost and charging circuits can be combined into a single bidirectional booster/charger 168 that acts to both charge the battery 120 under normal operating conditions and supply a DC voltage to the LED controller 40, 40' in emergency operation.

Operation of the bidirectional booster/charger 168 is controlled by two control signals CTRL3 and CTRL4 generated by the microcontroller 110. In normal operation, the bidirectional booster/charger 168 acts as a battery charger. In particular, in normal operation, the bidirectional booster/charger 168 receives a DC input voltage DC_IN at terminal T1 and provides a charging voltage VCHG to the battery 120 at terminal T2. In emergency mode, the bidirectional booster/charger 168 acts as a voltage booster, in which case the bidirectional booster/charger 168 receives a battery voltage signal VBATT at terminal T2 and provides a DC output voltage DC_OUT to the LED control module 50 at terminal T1.

Figure 11:
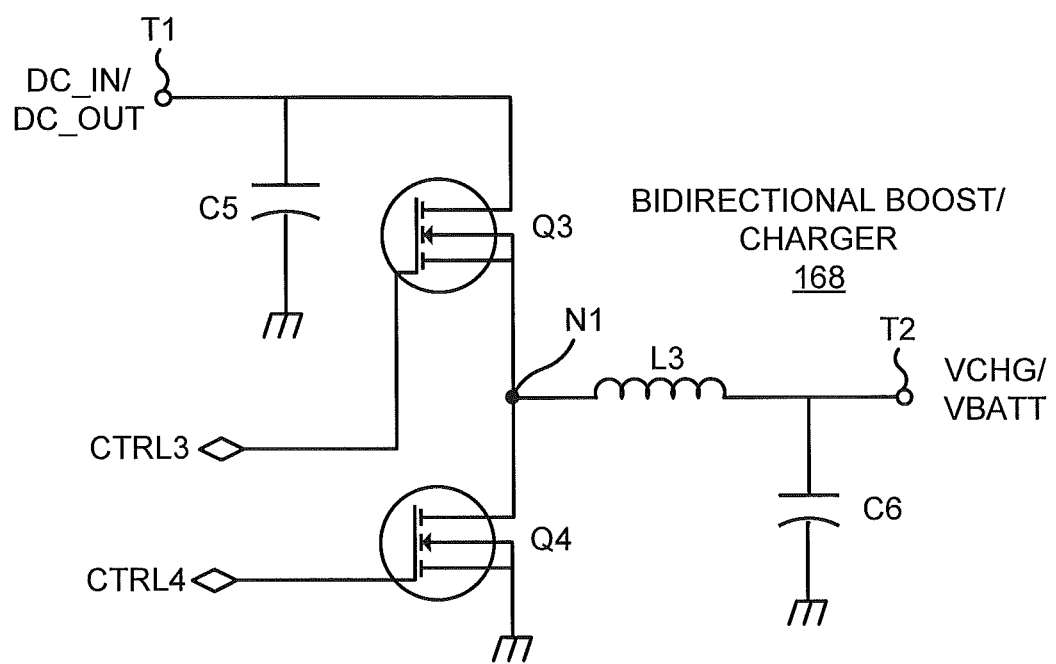
FIG. 11 is a circuit diagram of a bidirectional boost/charge converter circuit for an emergency lighting module according to some embodiments.

FIG. 11 is a circuit diagram of a bidirectional booster/charger 168 according to some embodiments. The bidirectional booster/charger 168 includes switching transistors Q3, Q4, which may be n-channel enhancement mode MOSFETs, although other types of suitably configured transistor switches can be used, including p-channel MOSFETs, bipolar junction transistors, etc. The bidirectional booster/charger 168 further includes capacitors C5, C6 and an inductor L3. A first input/output terminal T1 and a second input/output terminal T2 are provided.

In the bidirectional booster/charger 168, the power moves either direction based on how the switching transistors Q3, Q4 are driven. There are a number of challenges to implementing this circuit effectively. The challenge first is being able to control the voltages in each direction. The two circuit topologies (charger and booster) have very different transfer characteristics requiring what amounts to two separate control loops. These two loops then have to work together seamlessly based on which direction it is desired for the power to move.

The microcontroller 110 monitors the voltage and current at each end of the booster/charger 168 and drives the transistor switches Q3, Q4 directly in response to the measured voltages and currents. In such an implementation, control of the transistor switches can be implemented in software, which enables the microcontroller to customize the operation of the booster/charger 168 based on the type of luminaire and/or battery to which the emergency lighting module 100 is connected.

The transistors Q3 and Q4 are operated as switches under control of the microcontroller 110, which controls the ON/OFF state of the transistors Q3 and Q4 through control signals CTRL3 and CTRL4 applied to the gates of the transistors Q3, Q4, respectively.

In charging mode (normal operation), the circuit sees a voltage applied at terminal T1 and a load at terminal T2. In that case, the circuit steps the voltage level down from T1 to T2. When the transistor switch Q3 is in the ON (conductive) state and the transistor switch Q4 is in the OFF (nonconductive) state, the inductor L1 is connected to the source voltage DC_IN and energy is stored in the inductor L1. When the transistor switch Q3 is switched to the OFF (nonconductive) state, the transistor Q4 is switched to the ON (conductive) state, and energy is discharged from the inductor L1 into the output capacitor C6 using current drawn through the conducting switch Q4. Accordingly, in charging mode, the transistors Q3 and Q4 are driven with complementary control signals at a selected duty cycle Dchg.

By measuring the output voltage VCHG, the microcontroller 110 can control the switches Q3, Q4 to have duty cycles that maintain a constant output voltage on the output capacitor C6.

In charging mode, the output voltage VCHG is related to the input voltage DC_IN according to the following formula:

$$VCHG = Dchg * DC\_IN \quad [2]$$

In the boost mode (emergency operation), the circuit sees a voltage applied at terminal T2 and a load at terminal T1. In that case, the bidirectional booster/charger 168 causes the charge on the output capacitor C5 at terminal T1 to increase to a higher level than the input voltage VBATT applied at the terminal T2. When the transistor Q4 is in the ON (conductive) state and the transistor Q3 is in the OFF (nonconductive) state, current through the inductor L3 increases rapidly, causing the inductor L3 to absorb energy, which is stored in the magnetic field of the inductor. When the transistor Q4 is switched to an OFF (nonconductive) state and the transistor Q3 is switched to the ON (conductive) state, the inductor L3 discharges stored energy into the capacitor C5, which serves as an output capacitor in the boost mode. Accordingly, in boost mode, the transistors Q3 and Q4 are driven with complementary control signals at a selected duty cycle Dboost.

The voltage generated by the inductor L3 during the discharge phase is related to the rate of change of current through the inductor, and not to the original charging voltage, thus allowing the output voltage DC_OUT that is stored on the output capacitor C5 to exceed the input voltage VBATT. In boost mode, the output voltage DC_OUT is related to the input voltage VBATT according to the following formula:

$$DC\_OUT = VBATT/Dboost. \quad [2]$$

The charging subsystem of the emergency lighting module 100 includes the charger power supply electronics (i.e., the voltage charger 116 or bidirectional booster/charger 168), the microcontroller 110, an analog-to-digital converter (ADC), and a Pulse Width Modulation (PWM) output generator. The ADC and the PWM generator maybe implemented within the microcontroller 110 and/or as peripheral elements coupled to the microcontroller 110.

The voltage charger 116 or bidirectional booster/charger 168 provides the voltage and current needed for the charging process. The microcontroller 110 monitors both the charging voltage and the charging current via the ADC. The microcontroller 110 monitors the ADC values, and adjusts the charger PWM signal output accordingly. The charger PWM output provides the control signal CTRL1 for the charger 116 (FIG. 8) and/or CTRL3 and CTRL4 for the bidirectional booster/charger 168 (FIG. 11).

Charging a Lithium-Iron-Phosphate (LiFePO$_4$) battery requires precise monitoring and control. During an initial charging phase, the charging subsystem controls the PWM output to achieve a constant charging current in accordance with battery specifications. As the battery becomes charged, its voltage increases steadily under constant current conditions. Accordingly, the charging subsystem maintains a constant charging current while monitoring the battery 120 for increasing voltage.

Once the battery voltage reaches its target level, the charging subsystem modifies its output control to maintain a constant voltage on the battery 120. During this constant-voltage phase, the charging subsystem adjusts the control output to hold the charger voltage steady. For a normal LiFePO$_4$ battery charged with this method, the charge current will steadily decrease during the constant voltage phase.

During the constant voltage (CV) phase, the charging subsystem monitors the charger current, and stops charging when the charging current drops below the CV minimum charging current threshold. The microcontroller 110 updates a status flag register to "charged" and continues to monitor the battery voltage. The charging algorithm reverts to charging (starting with constant current) in the event that the battery voltage drops below a "turn on charger" threshold. In some embodiments, the microcontroller may wait until the "turn on charger" threshold has been sustained for a certain period of time, such as minute, before charging is resumed.

Accordingly, some embodiments provide a microcontroller-controlled charging control loop for a rechargeable battery in an emergency lighting module for a solid state luminaire. The microcontroller may implement a charging algorithm specifically tailored for a LiFePO$_4$ battery; however, the charging algorithm may be adapted to any battery technology needs. The charging algorithm may utilize only a portion of the microcontroller's feature set and bandwidth for charging, so that the microcontroller may perform many other tasks concurrently with battery charging. Moreover, the charging algorithm may utilize a controlled ramp up of the charging signal to simplify and/or replace a hardware control loop.

With the wide variety of lumen levels supported in luminaires with which an emergency lighting module may be used, it may not be cost effective to use a single battery pack to support all of them. A single battery pack would have to be sized to support luminaires with the highest lumen rating, and may be significantly oversized for luminaires with lower lumen ratings.

One solution is to use multiple battery packs much more tailored to meet the needs of a narrower range of applications. To reduce inventory and cost, it is desirable to use the same emergency lighting module electronics to support a variety of different battery packs. In order to accomplish this, it is desirable for the microcontroller of the emergency lighting module to be able to identify the battery capacity.

Figure 12A:
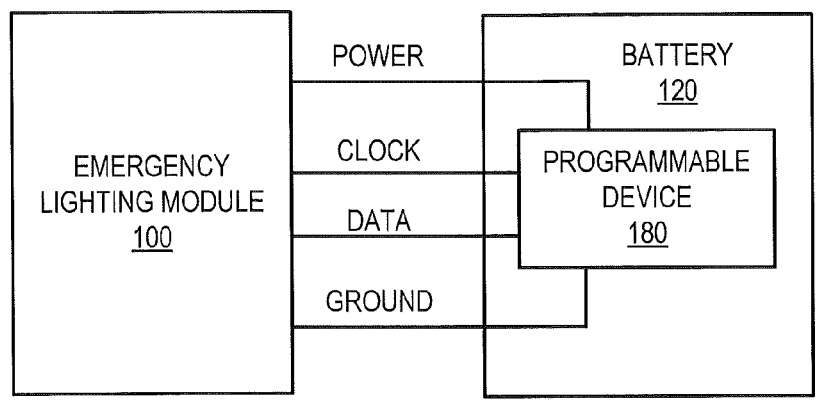
FIGS. 12A-12C are schematic diagrams of circuits according to some embodiments for identifying a battery that is connected to an emergency lighting module.
Figure 12B:
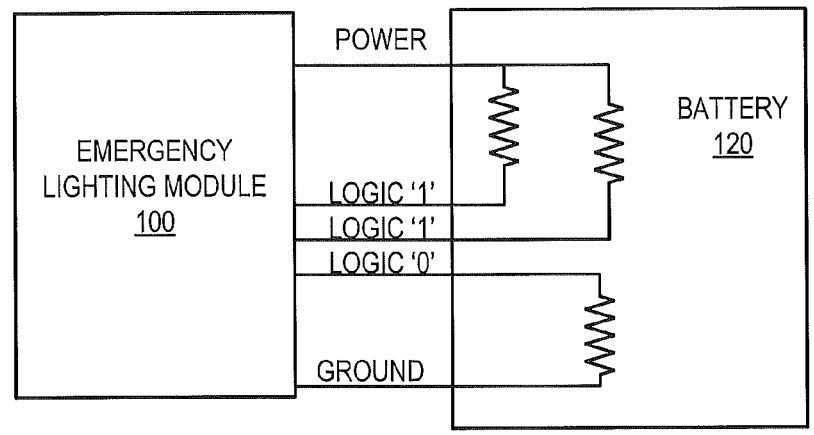
Figure 12C:
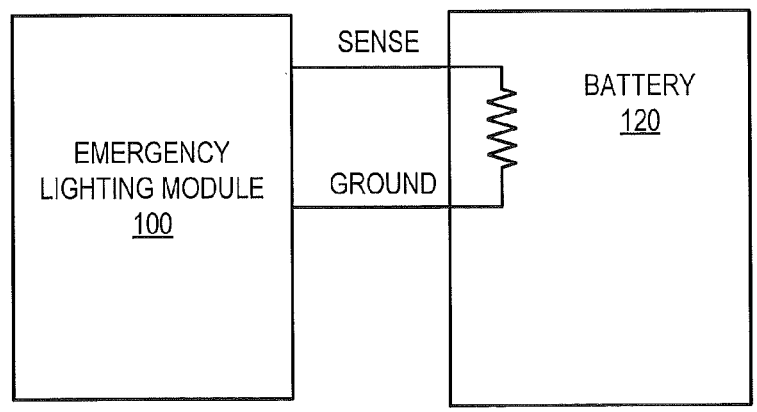

Methods for generating the battery type signal BT are illustrated in FIG. 12A to I$^2$C, and may include, but are not limited to, the use of an I$^2$C communication channel between the battery 120 and the emergency lighting module 100 (FIG. 12A). The I2C channel is implemented using a programmable device 180 in the battery 120 which communicates with the emergency lighting module using POWER, CLOCK, DATA and GROUND lines. In other embodiments, fixed interface lines tied to either a logic '1' or a logic '0' such that they may be read back by a digital controller (FIG. 12B) may be used. In the example shown in FIG. 13B, two of the data lines are tied to logic '1', while one is tied to logic '0'. With three data lines, up to eight different battery types can be recognized. In still further embodiments, a fixed resistor to which a current may be applied and the voltage read back by a microcontroller in the emergency lighting module 100 (FIG. 12C) is used to identify the battery 120. Any of these approaches may enable the microcontroller 110 to identify the type or model of battery that is connected to the emergency lighting module 100 and to adjust the charging and boosting algorithms of the emergency lighting module accordingly.

An alternative method of providing the BT signal is via configuration during product assembly. For this method, when the Printed Wiring Board Assembly (PWBA) containing the ELM microcontroller 110 is to be combined into a system with a known battery input, the microcontroller receives configuration information about the battery specification, and stores that information in non-volatile memory, for use by its control algorithms during emergency operation.

The life span of the battery 120 is expected to be significantly less than the life of the luminaire or emergency lighting module with which it is used. In order to further reduce cost and increase the service life of luminaires and emergency lighting modules, an emergency lighting module according to some embodiments includes a field replaceable battery pack.

Figure 13:
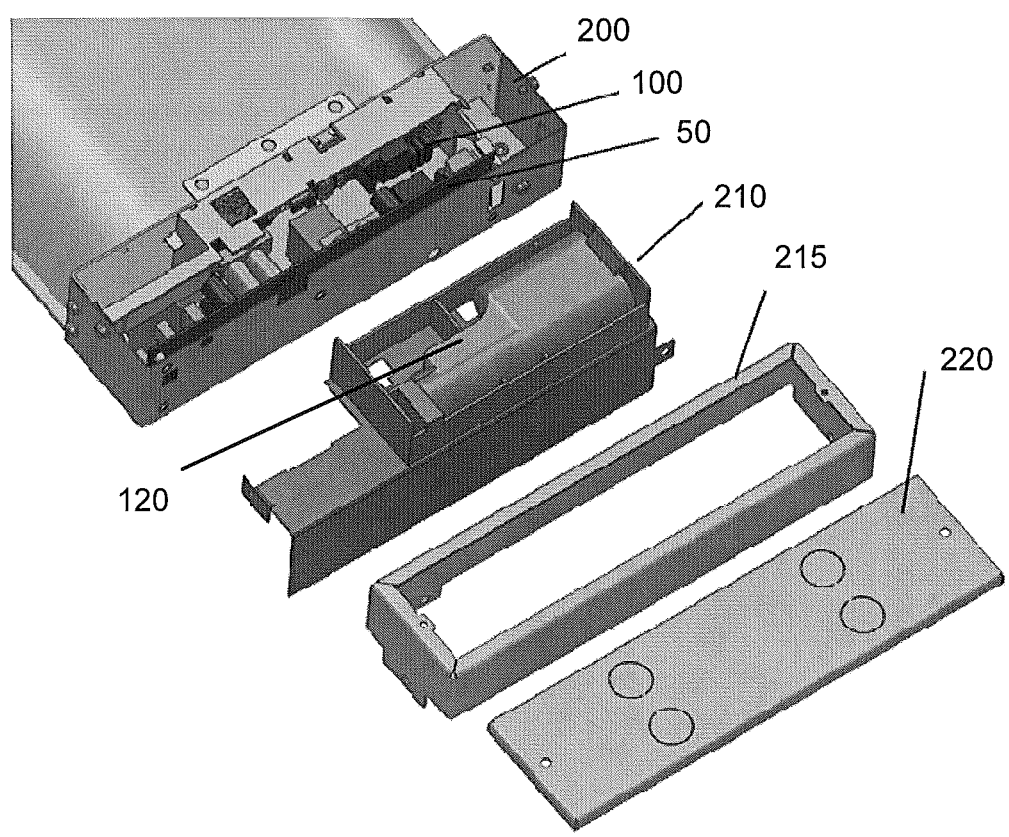
FIG. 13 is an exploded perspective view illustrating some mechanical aspects of a luminaire enclosure according to some embodiments.

Referring to FIG. 13, which is an exploded perspective view of a luminaire 70 including an emergency lighting module 100, a housing 200 houses LED control circuitry 50 and the emergency lighting module 100. An AC/DC converter 40 may also be enclosed within the housing 200. A battery 120 is mounted in a battery cage 210, which may be installed within the housing 200. A lid 220 may be placed over the housing to cover the components mounted therein, and a cover retainer 215 may be placed over the cover 220 to hold the cover 220 in place. When the cover retainer 215 and the cover 220 are removed, the battery 120 may be exposed for field replacement by a service technician.

By monitoring the AC line voltage, an emergency lighting module according to some embodiments may automatically detect loss of AC power and transition smoothly to emergency lighting operation in which power is supplied to the luminaire from the battery.

Solid state light sources are most efficiently driven from voltages that are nominally much greater than voltages generated by most battery packs. Battery packs are most efficient and cost effective when limited to two to four cells. In order to achieve increased efficiency for both devices it is desirable to use a voltage boosting circuit to step the battery voltage up to levels required to drive the LEDs. To simplify the emergency lighting control algorithm, it is desirable to control the transitions to and from battery power. In some embodiments, the battery booster voltage may be gradually increased when transitioning to battery operation. Likewise, the battery booster voltage may be gradually ramped down when transitioning off of battery operation. This allows gradual transition of load between the battery booster and the AC/DC converter.

Figure 14A:
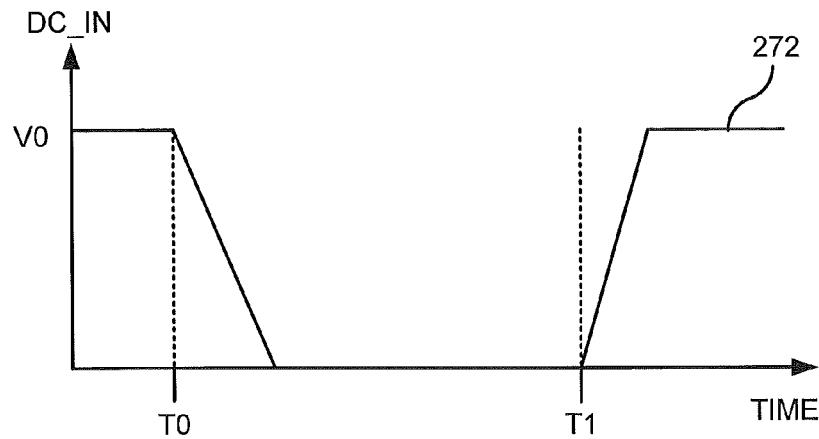
FIG. 14A to 14C are graphs of voltage versus time for voltages generated by an emergency lighting module and a solid state lighting module according to some embodiments.
Figure 14B:
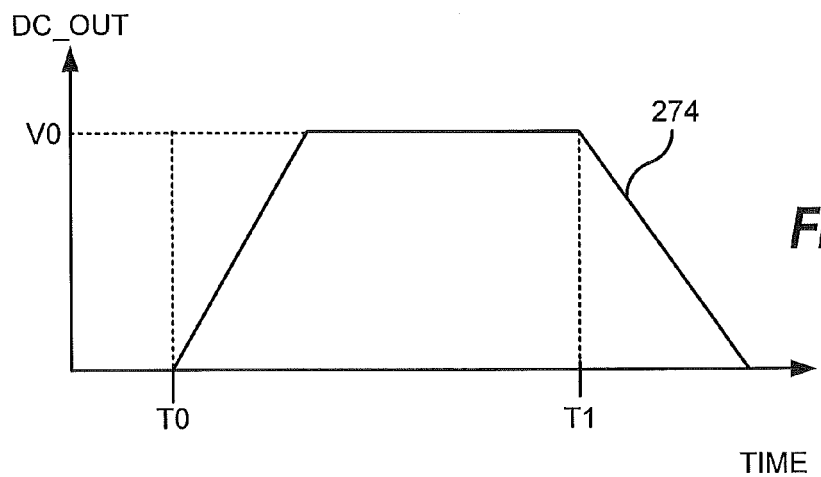
Figure 14C:
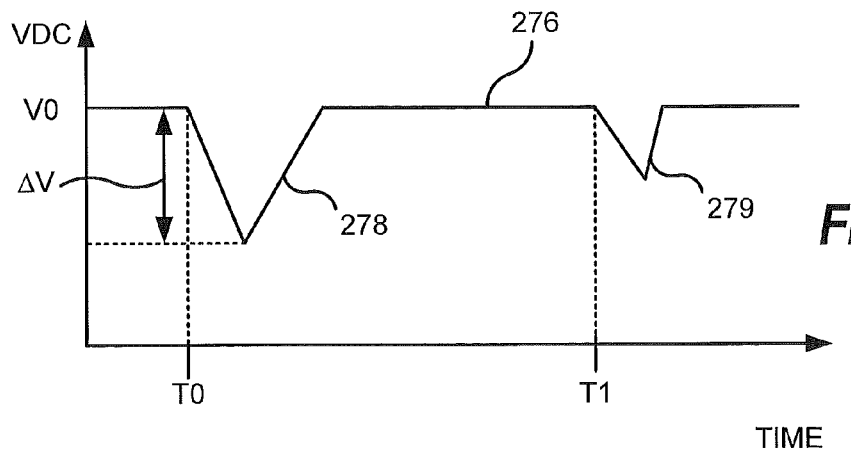

FIGS. 14A-C illustrate an example of a transition from normal operation to emergency operation and back to normal operation. FIG. 14A is a graph 272 of an exemplary DC_IN voltage generated by an AC/DC converter 40. As shown therein, the voltage DC_IN is generated by the AC/DC converter 40 at a voltage level V0. In some embodiments, V0 may be about 37 Volts; however, the level of V0 is dependent on the configuration of the LED control module 50 and the LED board 60. In general, for solid state lighting applications, V0 may bet between about 15 and 500 Volts.

At time T0, the AC line voltage input to the AC/DC converter 40 fails, at which point the DC voltage DC_IN begins to ramp down as capacitance in the AC/DC converter 40 discharges. At time T1, the AC line voltage is restored, at which point the voltage DC_IN begins to ramp back up to the V0 level.

FIG. 14B is a graph 274 of booster voltage DC_OUT generated by a voltage booster 118 or a bidirectional boost/charger 168 upon transition to battery power (emergency mode) and back to line power. Referring to FIG. 14B, at time T0, the microcontroller 110 detects a loss of AC line voltage. The loss of AC line voltage is detected directly from the line voltage or from a rectified AC output by the AC/DC converter 40 to the emergency lighting module 100. Thus, the emergency lighting module may detect loss of AC power before the DC voltage DC_IN output by the AC/DC converter 40 has dropped too far.

FIG. 14C is a graph 276 of the voltage VDC that is actually applied to the LED control module 50. As shown in FIGS. 4 and 5, the voltage VDC may be the diode-OR'ed product of DC_IN and DC_OUT. Accordingly, the voltage VDC may take the value of whichever of DC_OUT and DC_IN is greater. This may also prevent the back feed of DC_IN to DC_OUT or DC_OUT to DC_IN.

Referring again to FIGS. 14A-C, when emergency mode is entered at time T0, the microcontroller 110 causes the voltage booster 118 or bidirectional boost/charger 168 to begin generating a boosted output voltage DC_OUT. The level of DC_OUT increases from time T0 up to a maximum level V0, which may be equal to the level of DC voltage that would otherwise be supplied by the AC/DC converter 40 of the luminaire 70. The voltage level VDC supplied to the LED control module 50 may dip 278 when the DC_IN voltage drops. However, the DC_OUT voltage may begin to ramp up quickly enough that the voltage level VDC supplied to the LED control module 50 does not drop too far. For example, the DC_OUT voltage may ramp up quickly enough that the increasing level of DC_OUT exceeds the dropping value of DC_IN before the value of DC_IN drops by more than a predefined level ΔV, which may be about 4 Volts for a 37 Volt system. Ramping the voltage DC_OUT up to V0 may take about 0.1 to 4 seconds, and in some embodiments between about 0.01 and 100 seconds. Accordingly, the ramping rate up to V0 may be about 1 to 40 V/s. The DC_OUT level is maintained throughout emergency lighting operation until the battery is discharged or AC line power is resumed.

In the example illustrated in FIG. 14, the microcontroller 110 detects the resumption of AC line voltage at time T1. At that time, the microcontroller causes the voltage booster 118 or bidirectional boost/charger 168 to begin ramping the voltage back down as the voltage DC_IN begins to ramp back up. However, ramping down the DC_OUT voltage may be delayed slightly to ensure that there is only a slight dip 279 in the VDC signal. Ramping the voltage back down from V0 may take about 0.01 to 100 seconds. A manufacturer may desire to use an emergency lighting module as described herein in connection with many different types of luminaires. Thus, it is desirable for an emergency lighting module to support different lumen levels for different applications.

In some embodiments, the luminaire 70 provides a feedback signal MT to the emergency lighting module 100, 100' which indentifies the luminaire model, and which may be used by the emergency lighting module 100, 100' to determine the lumen level of the luminaire 70. Based on the lumen level of the luminaire 70, a PWM_OUT signal is generated to drive the luminaire at a desired lumen level for emergency lighting operation. This enables a single emergency lighting configuration to support multiple different lumen level luminaires and provide the same lumen level during emergency operation regardless of the lumen rating of the luminaire to which the emergency lighting module 100, 100' is connected.

For example, if the desired emergency lighting level is 1000 lumens, a luminaire 70 rated at 4000 lumens may be driven by the emergency lighting module 100, 100' at a fixed PWM duty cycle corresponding to 1000 lumen operation. A luminaire rated at 2000 lumens may be driven at a different PWM duty cycle for the same 1000 lumen operation. This configuration may promote consistent emergency operation with the same battery size.

Figure 15A:
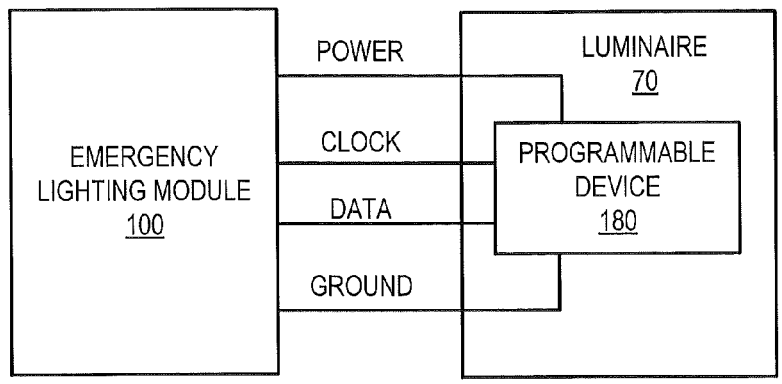
FIGS. 15A-15C are schematic diagrams of circuits according to some embodiments for identifying a luminaire that is connected to an emergency lighting module.
Figure 15B:
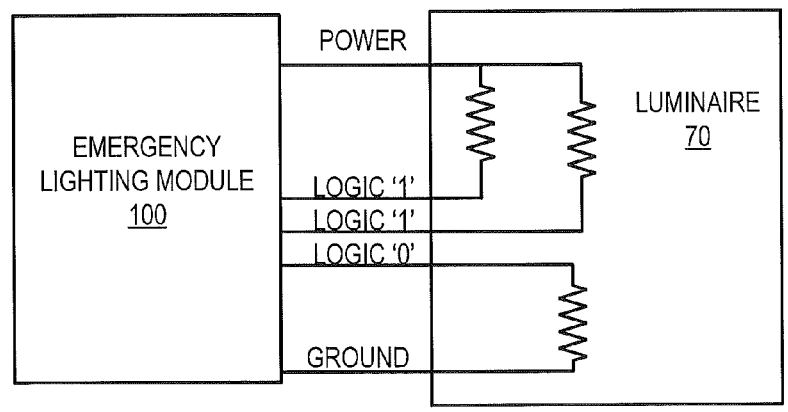
Figure 15C:
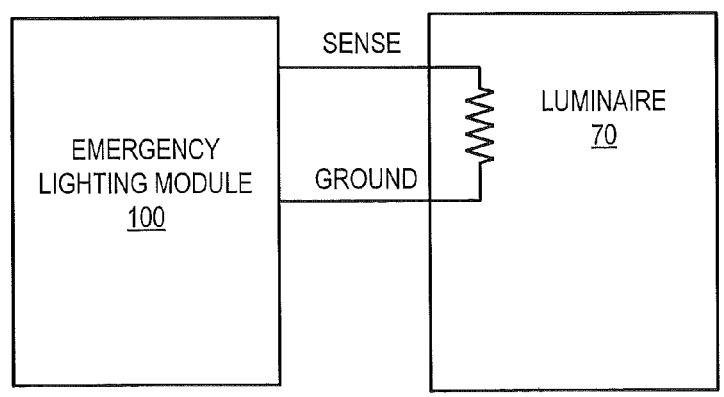

Methods for generating the module type signal MT are illustrated in FIGS. 15A to 15C, and may include, but are not limited to, the use of an I$^2$C communication channel between the luminaire 70 and the emergency lighting module 100 (FIG. 15A). The I2C channel is implemented using a programmable device 180 in the luminaire 70 which communicates with the emergency lighting module using POWER, CLOCK, DATA and GROUND lines. In other embodiments, fixed interface lines tied to either a logic '1' or a logic '0' such that they may be read back by a digital controller (FIG. 15B) may be used. In the example shown in FIG. 12B, two of the data lines are tied to logic '1', while one is tied to logic '0'. With three data lines, up to eight different luminaire types can be recognized. In still further embodiments, a fixed resistor to which a current may be applied and the voltage read back by a microcontroller in the emergency lighting module 100 (FIG. 15C) is used to identify the luminaire 70. Any of these approaches may enable the microcontroller 110 to identify the type or model of luminaire to which the emergency lighting module 100 is connected, and thereby infer the rated lumen level of the luminaire.

It will be appreciated that in place of an I$^2$C connection, an Ethernet, synchronous or asynchronous serial or parallel interface, or any other communication protocol may be employed.

An alternative method of providing the MT signal is via configuration during product assembly. For this method, when the Printed Wiring Board Assembly (PWBA) containing the ELM microcontroller is to be combined into a system with a known light output, the microcontroller receives configuration information about the light output requirement, and stores that information in non-volatile memory, for use by its control algorithms during emergency operation.

While in emergency lighting mode, the emergency lighting module monitors the battery voltage and current while driving the LED control module 50 via the dimmer pulse width modulation signal PWM_OUT generated by the microcontroller 110.

Figure 16:
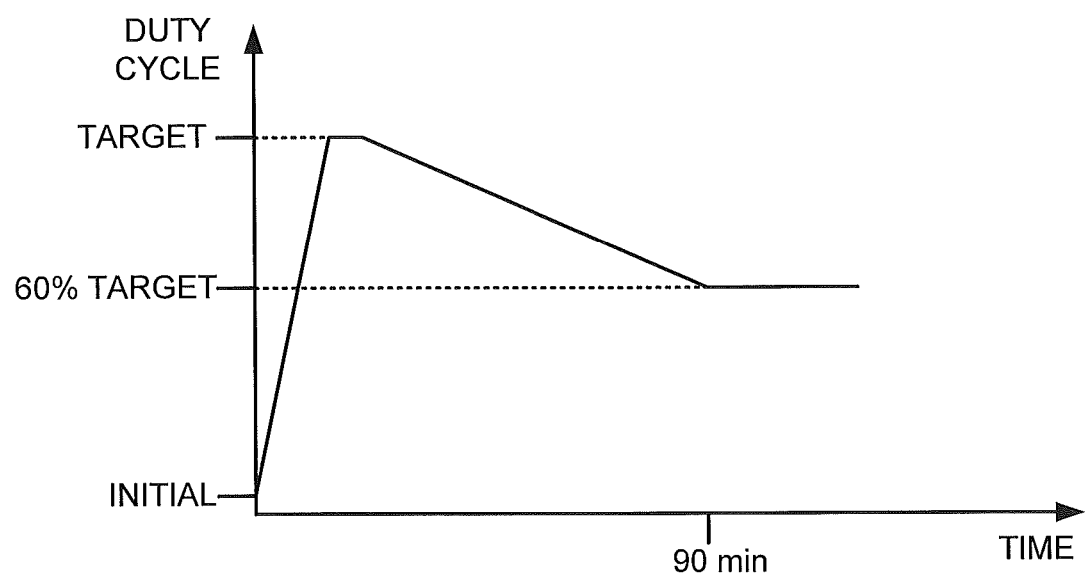
FIG. 16 is a graph of duty cycle versus time for pulse width modulated dimming signal generated by an emergency lighting module according to some embodiments.

FIG. 16 is a graph of duty cycle versus time for a PWM signal generated by a microcontroller 110 of an emergency lighting module 100 according to some embodiments. When switching to battery power, the microcontroller 110 may start the dimmer PWM_OUT signal at a low initial duty cycle (for example about 1%), and may thereafter ramp the PWM_OUT signal to a desired duty cycle, (e.g., 35%) shown in FIG. 15 as TARGET. Ramping the PWM_OUT signal may avoid start-up issues with the driver circuit in the LED control module 50. Once the microcontroller 110 has ramped the PWM_OUT signal to the target duty cycle, the target duty cycle is maintained for an initial period, which may in some cases be about three minutes. At the end of the initial period, the microcontroller 110 may begin a gradual ramp down of the duty cycle to achieve a final PWM duty cycle of nominally 60% of the target duty cycle at ninety (90) minutes after the emergency lighting module 100 entered the emergency lighting mode. For example, if the target duty cycle is 35%, the ending duty cycle will be about 21% at the 90 minute mark. The ramp down may be linear, quasi-linear, parabolic, piecewise linear, exponential, or may follow any other waveform. The final PWM_OUT duty cycle is maintained until either power is re-applied, or the battery drops below the fully-discharged level. If the battery level drops to the fully discharged level, the microcontroller 110 shuts down the lamp drive and enters low power mode until power is restored.

The ramp down of the PWM_OUT dimming signal described above meets the Underwriters Laboratories UL924 standard requirement that the final light output of an emergency egress light be 60% of the initial value. In addition, by ramping down the dimming, the emergency lighting module 100 conserves power, which allows for a smaller capacity battery (and lower cost) than would be required if the dimming signal were held steady for the entire 90 minutes.

Ramping down the PWM_OUT dimming signal causes the light emitted by the luminaire 70 to decrease over time, which provides a visual indicator to building occupants that the emergency lighting power is decreasing, which may encourage occupants to exit the building sooner.

With the use of a digital controller additional operational improvements can be made by sensing the light output and/or temperature of the luminaire 70 directly. The LED string current and voltage may be adjusted in response to sensor measurements to maintain optimal efficiency and light output quality.

In some further embodiments, the power good output of the lighting controller may be monitored by the emergency lighting controller 100, which may respond to abnormal conditions and improve overall efficiency and reliability.

Referring again to FIG. 6, an emergency lighting module 100 according to some embodiments includes a test switch 135 that may be used to initiate test operation of the emergency lighting module 100. Implementation of test functions may be necessary to comply with product certification requirements. The emergency lighting module 100 may also include a status indicator 140, which may be an LED status indicator, that can provide feedback to the user as to the status of the emergency lighting module, the level of charge currently available on the battery, etc. Charge status of the battery may be indicated, for example, by flashing an indicator lamp at an increasing rate as the battery takes more charge, by providing a series of indicator lamps and progressively lighting indicator lamps in the series until the battery is charged, etc.

The emergency lighting module test switch subsystem includes the test switch 135 and the microcontroller 110 which implements an algorithm for managing the test switch 135.

In some embodiments, the microcontroller 110 may respond to actuation of the test switch by initiating a battery test only if the battery is fully charged. However, in other embodiments, the battery may not need to be fully charged before a test is initiated.

From an initial state, the microcontroller may measure the duration of a test switch signal. When the test switch is de-actuated (e.g., a pushbutton switch is released), the microcontroller may activate either a "monthly" or "yearly" test, depending on duration of the test switch actuation. The monthly test may be a brief (e.g. thirty second) test to ensure that the luminaire will operate on battery power in response to a loss of the AC line voltage. The yearly test may be a more thorough test that verifies the luminaire will continue to run for a full ninety minutes on battery power after loss of the AC line voltage.

For example, if the test switch is actuated momentarily (e.g., a pushbutton switch is held down for less than ten seconds), the microcontroller 110 may initiate the "monthly" test; if the button is actuated for more than ten seconds, the microcontroller 110 may initiate the more exhaustive "yearly" test. In other embodiments, if the button is held down for more than a predefined period of time, the emergency light module will begin a test that operates only so long as the button is held down.

Once a battery test is initiated, the microcontroller 100 may activate a five second timer during which it ignores additional button presses (the "cancel lock-out period").

Subsequent the cancel lock-out period, the microcontroller 110 may resume monitoring the test switch 135. If the user actuates the test switch after the 5-second cancel lock-out period has elapsed, the microcontroller 110 may proceed to cancel the battery test.

If the battery test fails, the microcontroller may place the emergency lighting module 110 in a "fail wait" state until the test switch 135 has been pressed and released.

If the test switch 135 is actuated for more than ten seconds, the emergency lighting module 100 may switch to emergency (battery power) mode for a full ninety minutes.

The microcontroller 110 may be configured to ignore requests to initiate battery testing unless the battery is fully charged and the AC line voltage is present.

Figure 17:
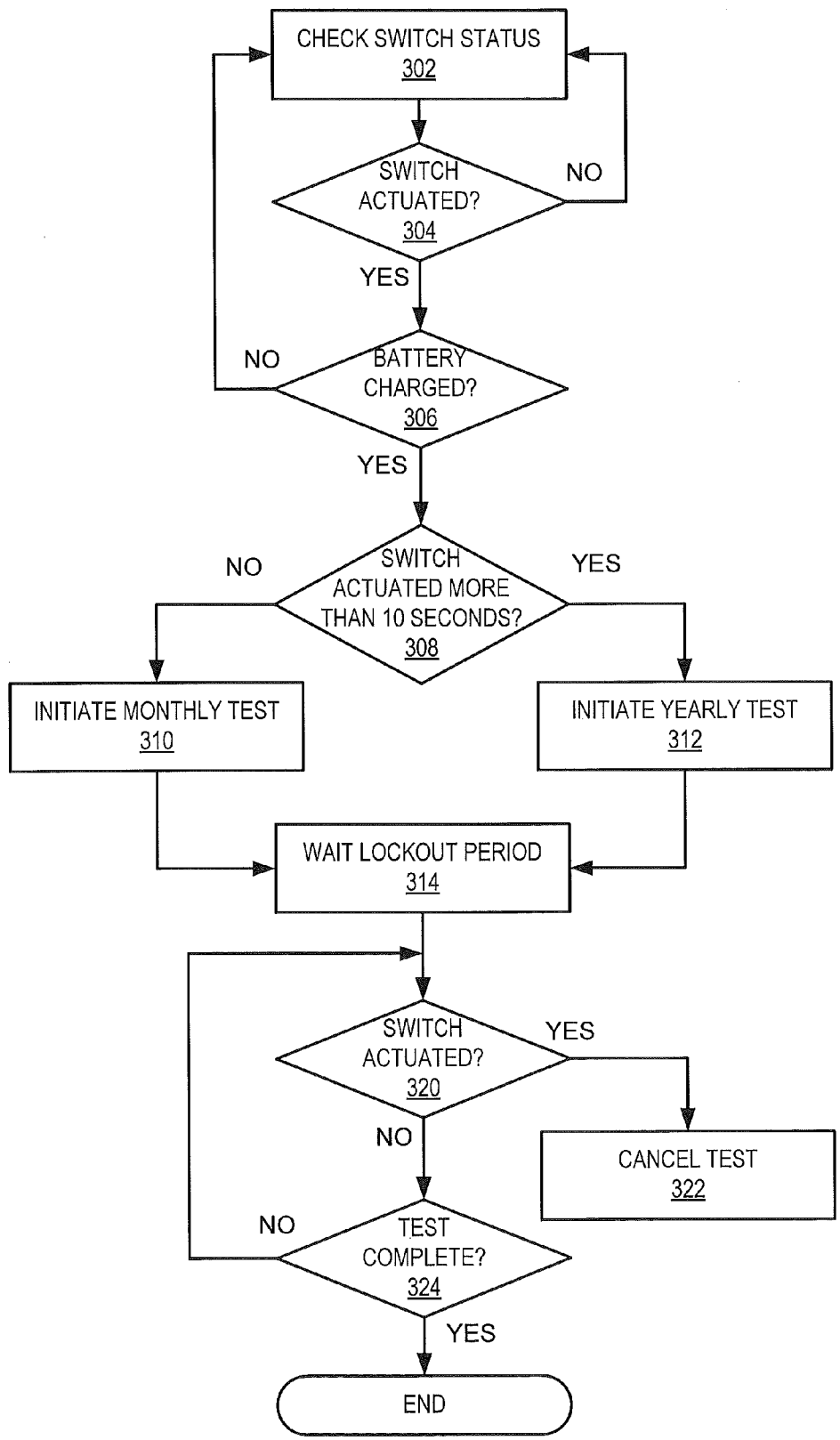
FIG. 17 is a flowchart that illustrates systems/methods for performing emergency lighting tests by an emergency lighting module according to some embodiments.

Test switch handling is illustrated, for example, in the flowchart of FIG. 17. As shown therein, the microcontroller 110 monitors the status of the test switch 135 (block 302). If the switch is activated (block 304), operations proceed to block 306. Otherwise, the microcontroller 110 continues to monitor the status of the switch.

After activation of the switch, at block 306, the microcontroller 110 checks to see if the battery 120 is fully charged. If not, the microcontroller ignores the switch, and operations return to block 302 to continue to monitor the switch status.

If the battery is fully charged, the microcontroller 110 then checks to see if the switch was actuated for more than a threshold time, such as for more than ten seconds (block 308). If not, a monthly test is initiated (block 310), and if so, a yearly test is initiated (block 312).

The microcontroller then starts a cancel lockout period, such as five seconds, during which time it ignores further button presses (block 314). After the end of the lockout period, the microcontroller 110 again monitors the switch status (block 320). If the switch is activated again, the microcontroller 110 will cancel the current test (block 322). If the switch is not activated, the microcontroller checks to see if the test is complete (block 324), and if not returns to block 320 to check the status of the test switch at block 320. If the test is complete, the operations of FIG. 17 may be restarted from the beginning.

The battery testing simulates an on-battery (i.e., emergency lighting) scenario. In a yearly test scenario, the emergency lighting module 100 operates as described above, ramping from the initial value to 60% of the initial value over the course of the 90-minute battery test.

Figure 18A:
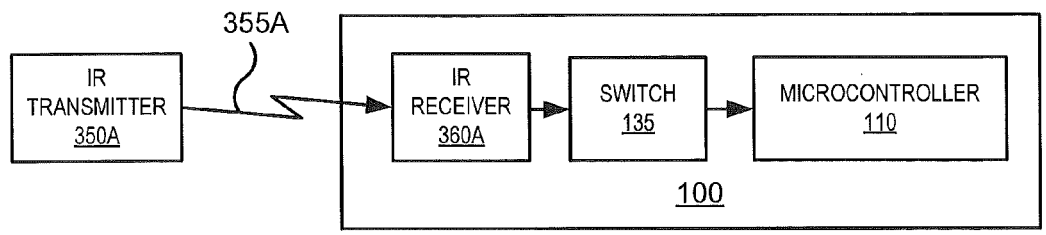
FIGS. 18A-18D are schematic diagrams illustrating various apparatus/methods for wireless actuating a test switch of an emergency lighting module according to some embodiments.

Although described above as a pushbutton switch, the test switch 135 may be implemented in a number of different ways, as illustrated in FIGS. 18A-18D. In particular, some embodiments provide a wireless interface for actuating the test switch 135. Referring to FIG. 18A, the test switch 135, which is coupled to the microcontroller 110 in an emergency lighting controller 100, may be actuated by an infrared receiver 360A in response to an infrared signal 355A transmitted by an infrared transmitter 350A.

Figure 18B:
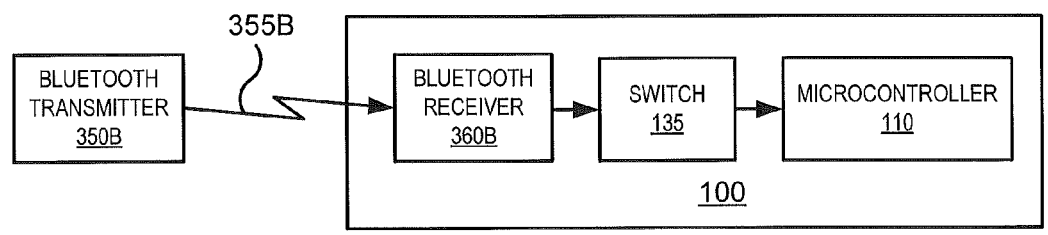

Similarly, referring to FIG. 18B, the test switch 135 may be actuated by a Bluetooth receiver 360B in response to a Bluetooth signal 355B transmitted by a Bluetooth transmitter 350B.

Figure 18C:
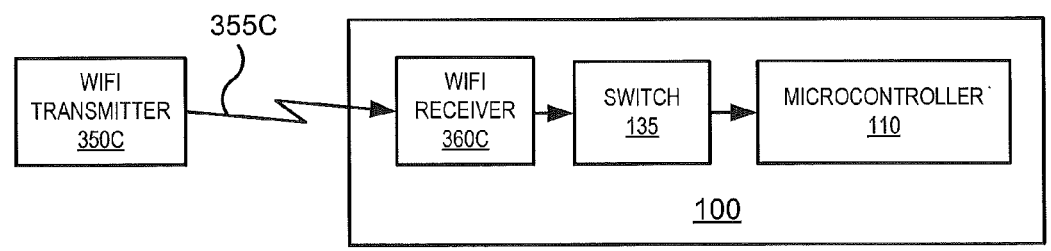

Referring to FIG. 18C, the test switch 135 may be actuated by a WIFI receiver 360C in response to a WIFI signal 355C transmitted by a WIFI transmitter 350C.

Figure 18D:
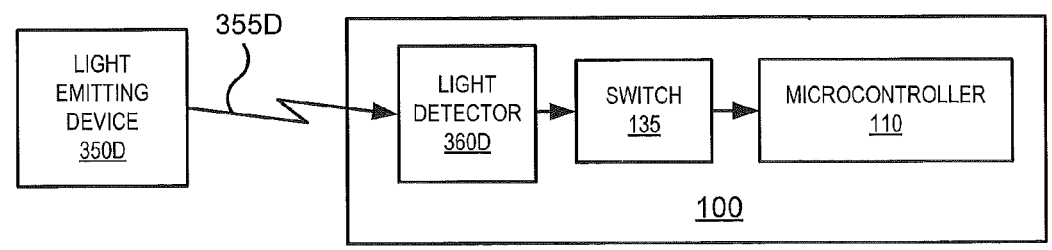

Referring to FIG. 18D, in other embodiments the test switch 135 may be actuated by a visible light detector 360D in response to a visible light signal 355D transmitted by a light emitting device 350D, such as a flashlight, laser pointer, etc.

Providing a wireless interface to a test switch of an emergency lighting module may be particularly beneficial for installations where the luminaire is mounted out of reach, so that a technician is not required to physically climb up to the location of the luminaire in order to manually engage a pushbutton switch.

Referring again to FIG. 6, the emergency lighting module 100 may further include a status indicator 145, which may include one or more light emitting diodes of different colors.

Using the status indicator 145, the emergency lighting module 100 may display information about various machine conditions, including battery charging, battery charged, battery test in progress, "on battery" (i.e., emergency) operation, battery failure, etc.

In some embodiments, the status indicator 145 may include one red and one green LED for indicating the state of the emergency lighting module 100. With two LEDs, there are many possible combinations of distinct LED flashing sequences, allowing greater detail to be displayed and easily interpreted. For example, an alternating red and green pattern may be used for indicating a test sequence. Table 1 lists several possible LED indicator combinations for use in the emergency lighting application.

TABLE 1

Status Indicator Key

| ELM State | LED State |
| --- | --- |
| AC present, Battery fully charged (includes trickle charge) | GREEN ON<br>RED OFF |
| AC present, Battery charge in progress | GREEN FAST BLINK<br>RED OFF |
| AC present, Test in progress | Alternate blinking RED/GREEN |
| AC present, Test complete: | Battery Test Passed = back to battery charge in progress state (GREEN FAST BLINK, RED OFF)<br>Battery Test Failure = GREEN OFF, RED FAST BLINK |
| AC not present, running on battery | GREEN OFF<br>RED SLOW BLINK |
| Fatal Error Battery Low | GREEN OFF<br>RED Double BLINK |
| Fatal Error (Other) | GREEN OFF |

TABLE 1-continued

Status Indicator Key

| ELM State | LED State |
|---|---|
| | RED Triple BLINK |
| Pushbutton Stuck Low | GREEN Double BLINK |
| | RED OFF |
| Non-Fatal Error (Other) | GREEN Triple BLINK |
| | RED OFF |
| Stuck in Initial State (VSEC below threshold) | Green Toggle (on/off) RED OFF |

In other embodiments, the status indicator may include an alphanumeric LCD display that can display status information alphanumerically under control of the microcontroller 110.

In many environments, dimming is an important feature for a light fixture to implement. Various different dimming technologies have been developed for both incandescent and fluorescent lighting, which represent the vast majority of installed commercial lighting facilities today. As solid state lighting fixtures are developed and become more available as a replacement technology for incandescent and fluorescent lighting, it is desirable for solid state luminaires to respond appropriately to dimming signals generated by various different types of dimming systems.

One rudimentary method of dimming control is referred to as step dimming. Step dimming uses multiple switches that allow a user to select one of several (e.g., two or three) different brightness levels for a light fixture by appropriate setting of multiple switches. For example, in a three-bulb fluorescent fixture, one switch may control the two outer bulbs, while another switch may control the single inner bulb. By setting the switches appropriately, the user can turn on one, two, three or no bulbs in the fixture at one time, effectively providing four levels of dimming.

0-10 V dimming is an electronic lighting control signaling system that enables continuous dimming between brightness levels. A 0-10V dimming switch generates a DC voltage that varies between zero and ten volts in response to a user setting, such as the position of a slide switch or a dial connected to a potentiometer. The controlled lighting fixture typically scales its output so that it emits full brightness in response to a 10 V control signal and is off (zero brightness) in response to a 1 V control signal. Dimming devices may be designed to respond in various patterns to the intermediate voltages, such as giving output curves that are linear for voltage output, actual light output, power output, perceived light output, etc.

Dimming fluorescent ballasts and dimming LED drivers often use 0-10 V control signals to control dimming functions. In many cases, however, the dimming range of the power supply or ballast is limited.

Digital Addressable Lighting Interface (DALI) is a technical standard for network-based systems that control lighting in buildings. It was established as a successor for 0-10 V lighting control systems. The DALI standard, which is specified in the IEC 60929 standard for fluorescent lamp ballasts, encompasses the communications protocol and electrical interface for lighting control networks. A DALI network consists of a controller and one or more lighting devices (e.g., electrical ballasts and dimmers) that have DALI interfaces. The controller can monitor and control each light by means of a bi-directional data exchange. Data is transferred between controller and devices by means of an asynchronous, half-duplex, serial protocol over a two-wire differential bus.

A luminaire may be designed to respond to multiple types of dimming control signals including, for example, step dimming control signals, 0-10V dimming control signals, DALI dimming control signals, and other dimming control signals. In addition, a luminaire may be designed to respond to a PWM_OUT dimming signal generated by an emergency lighting module as disclosed above.

Figure 19:
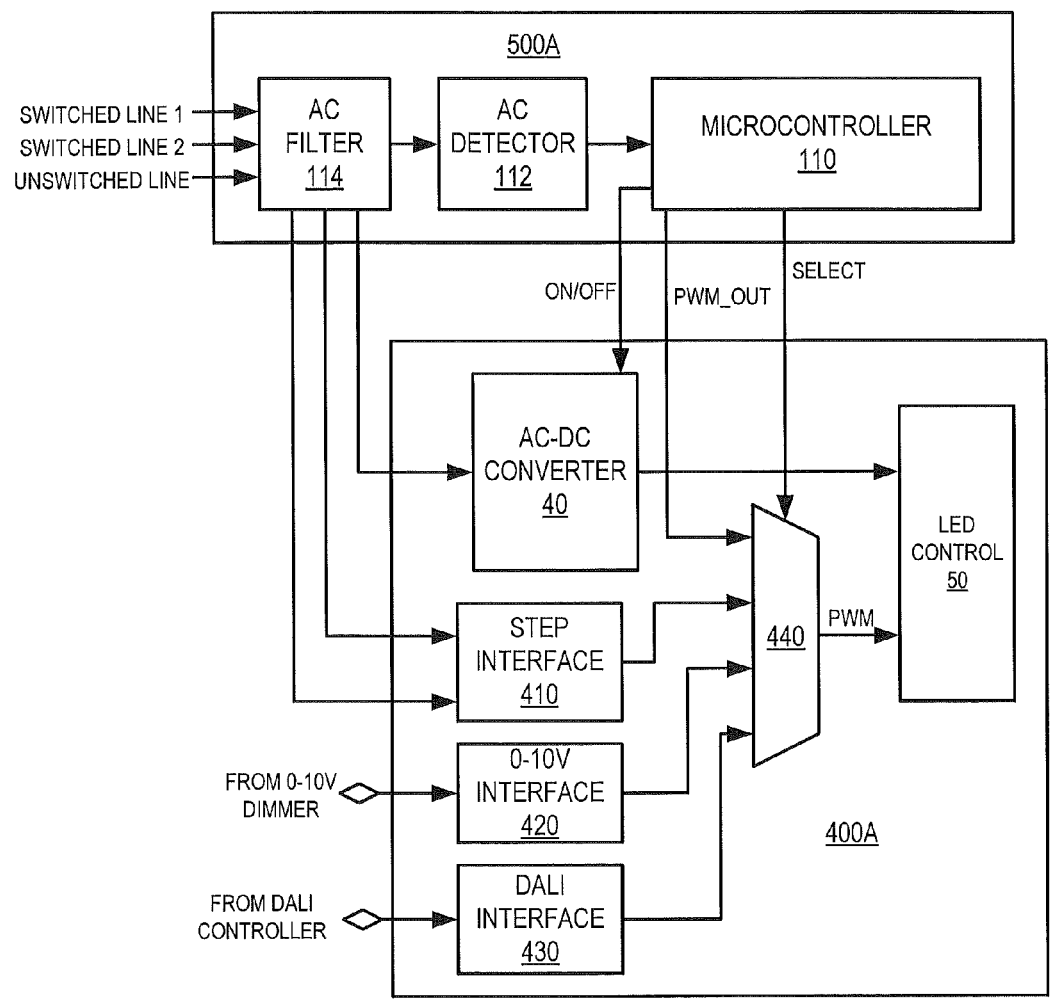
FIGS. 19-21 are schematic diagrams of emergency lighting modules and solid state luminaire power boards that are configured to implement various types of dimming functions in accordance with some embodiments.

FIG. 19 illustrates an emergency lighting controller 500A according to some embodiments that is connected to a power board 400A of a luminaire according to some embodiments. The power board 400A includes the AC/DC converter 40, 40' and the LED control module 50 described above in connection with FIGS. 4 and 5, but does not include the LED board 60 of the luminaire. The emergency lighting module 500A may be configured in a similar manner as the emergency lighting modules 100, 100' described above, except that the emergency lighting module 500A is additionally configured to output a dimming signal source select signal SELECT to the LED board 400A as described in more detail below.

The LED board 400A may be configured to handle dimming signals generated by many different types of dimming systems, including step dimming, 0-10V dimming, DALI dimming, and/or other types of dimming signals. For example, the LED board 400A may include a step dimming interface 410 that detects the presence of AC signals on multiple switched AC lines corresponding to the state of one or more step dimming switches. The LED board 400A may also include a 0-10V interface 420 that is configured to process a 0-10V dimming signal. Alternatively or additionally, the LED board 400A may also include a DALI dimming interface 430 that is configured to communicate with a DALI controller (not shown) and to receive and process DALI dimming signals.

The step dimming interface 410 may include one or more AC detectors that detect the presence of AC voltage on multiple switched lines based on AC signals provided by the AC filter 114 in the emergency lighting module 500A. In response, the step interface 410 is configured to generate a PWM signal indicative of the state of the switched lines to a multiplexer 440. For example, in the case of two switched lines, the step interface 410 may generate a PWM signal having a duty cycle of 100% if both switched lines are powered, a PWM signal having a duty cycle of 50% if only one switched line is powered, and a duty cycle of 0% if neither switched line is powered. Other arrangements are also possible. For example, the step interface could generate a PWM signal having a duty cycle of 30% if switched line 1 is powered and switched line 2 is unpowered, and a PWM signal having a duty cycle of 60% if switched line 1 is unpowered and switched line 2 is powered.

The 0-10V interface 420 is configured to detect the voltage level provided by a 0-10V dimmer and generate a PWM signal having a duty cycle related to the level of the 0-10V signal. For example, the duty cycle of the PWM signal generated by the 0-10V interface 420 could be directly proportional to the voltage level of the 0-10V signal (e.g., generates a 50% duty cycle in response to a 5V signal, a 60% duty cycle in response to a 6V signal, etc.). In other embodiments, the duty cycle of the PWM signal may be related in a linear or nonlinear fashion to the voltage level of the 0-10V signal in order to provide, for example, PWM signals that result in linear changes in voltage output, actual light output, power output, perceived light output, etc., of the luminaire. The PWM signal output by the 0-10V interface 420 is provided as an input to the multiplexer 440.

The DALI interface 430 may include circuitry for communicating with a DALI controller using asynchronous, half-duplex, serial protocol over a two-wire differential bus, and processing the DALI signals to generate a PWM signal in response to dimming commands received over the DALI interface. The PWM signal output by the DALI interface 430 is also provided as an input to the multiplexer 440.

It will be appreciated that in a particular installation, only one type of dimming control will be available. Thus, the multiplexer 440 will receive only one PWM input from the step interface 410, the 0-10V interface 420 and the DALI interface 430. The DALI interface may be a standard DALI interface. The 0-10V interface may include an analog to digital converter that converts an analog 0-10V signal to a digital signal and a microcontroller that reads the digital signal and responsively generates a PWM signal that is provided to the multiplexer 440. Similarly, the step interface may include analog and/or digital circuitry that converts a step voltage signal to a PWM signal. The design of such interface circuits is well known in the art.

The PWM dimming control signal PWM_OUT generated by the microcontroller 110 is also provided as an input to the multiplexer 440. The multiplexer 440 selects a PWM dimming control signal from either the PWM_OUT signal generated by the microcontroller 110 on the one hand or an available one of the PWM signals generated by the step interface 410, the 0-10V interface 420 or the DALI interface 430 on the other hand and supplies the selected PWM signal to the LED control module 50 in response to the SELECT signal output by the microcontroller 110. Accordingly, in the event of a power loss, dimming control of the luminaire may be taken over by the emergency lighting module 500A. In that case, dimming of the luminaire is based on the PWM_OUT dimming signal output by the microcontroller 110, and any dimming signal generated by the normal dimming system (e.g., step, 0-10V or DALI) is disregarded by the luminaire.

Figure 20:
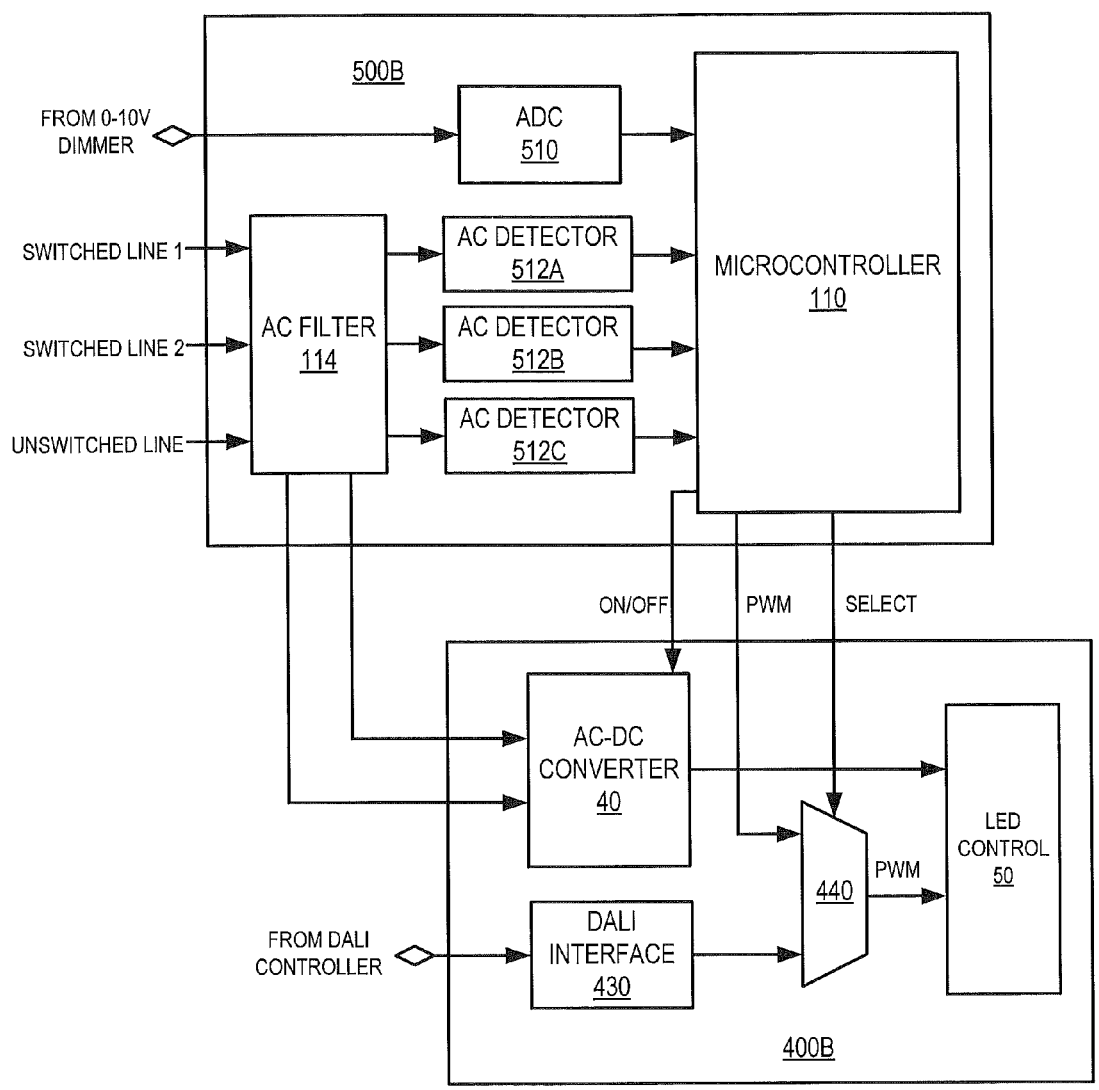

An emergency lighting controller 500B and a power board 400B of a luminaire according to further embodiments are illustrated in FIG. 20. The emergency lighting controller 500B and power board 400B shown in FIG. 20 are similar to the emergency lighting controller 500A and power board 400A shown in FIG. 19, except that in the embodiments illustrated in FIG. 20, some of the dimming control functionality is moved to the emergency lighting controller 500B.

Referring to FIG. 20, the emergency lighting controller 500B includes an analog to digital converter 510 that receives the 0-10V signal from a 0-10V dimmer (not shown) and generates a digital value that is proportional to the level of the 0-10V signal. It will be appreciated that the ADC 510 can be integrated in the microcontroller 110 and/or implemented as a separate peripheral component thereof. The emergency lighting controller 500B also includes separate AC detectors 512A-512C for detecting the presence of AC voltage on multiple switched lines (switched line 1 and switched line 2) as well as an unswitched AC line. The microcontroller 110 can determine the state of a step dimming control based on the detected presence or absence of AC voltage on the switched lines.

The microcontroller 110 may therefore generate the PWM_OUT dimming signal in response to a step dimming signal, a 0-10V dimming signal, or in response to a loss of AC power on the unswitched AC line. The PWM_OUT signal may therefore be generated by the emergency lighting module 500B during normal operation, and not just during emergency operation. However, since the power board 500B still includes a DALI interface 430, the microcontroller 110 still generates a SELECT signal to cause the multiplexer 440 to select between the PWM_OUT signal generated by the microcontroller 110 and the PWM signal generated by the DALI interface 430. A jumper setting in the emergency lighting module 500B may be used to indicate to the microcontroller 110 which type of dimming control is being used. In other embodiments, configuration data that is written to a programmable device at the time of manufacture may be used to identify the type of dimming control that is used.

Figure 21:
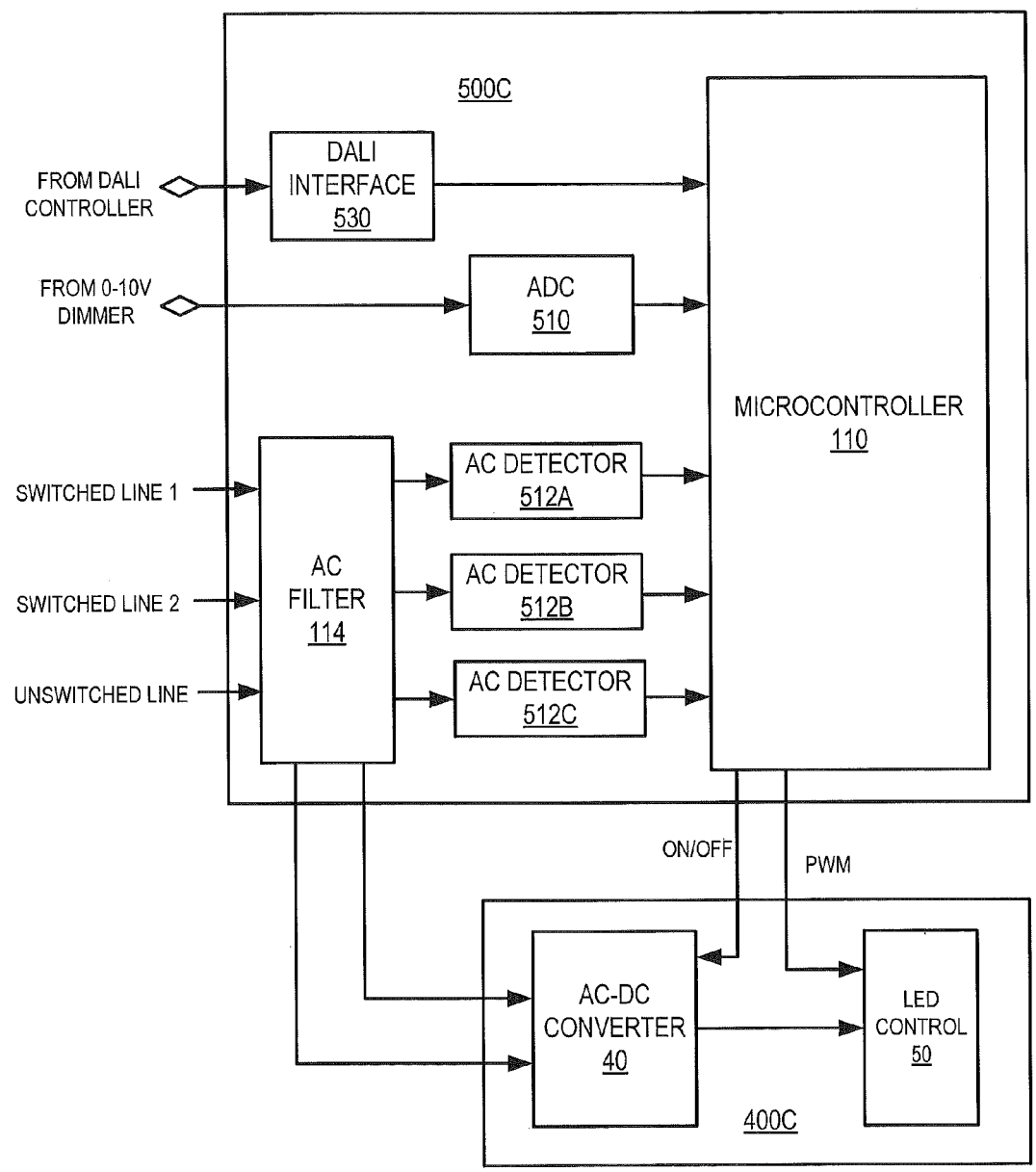

An emergency lighting controller 500C and a power board 400C of a luminaire according to further embodiments are illustrated in FIG. 21. The emergency lighting controller 500C and power board 400C shown in FIG. 21 are similar to the emergency lighting controller 500B and power board 400B shown in FIG. 20, except that in the embodiments illustrated in FIG. 21, all of the dimming control functionality is moved to the emergency lighting controller 500C.

Referring to FIG. 21, the emergency lighting controller 500C includes a DALI interface that communicates with a DALI controller (not shown) to receive and process DALI dimming control commands. In this embodiment, all dimming by the power board 400C is controlled by the PWM_OUT signal generated by the microcontroller 110. Accordingly, power board 400C does not include a multiplexer and the microcontroller 110 does not have to generate a SELECT signal to control its operation.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An emergency lighting module for providing emergency power to a solid state luminaire, the emergency lighting module comprising:
   a first output configured to supply a DC output voltage to the solid state luminaire responsive to a reduction of an AC line voltage;
   a first input configured to receive a DC input voltage from the solid state luminaire, the solid state luminaire comprising a lighting board, which comprises lighting elements, and a lighting control module that is configured to drive the lighting elements responsive to a logical OR of the DC output voltage and the DC input voltage; and
   a second input configured to receive a status signal indicative of the status of the AC line voltage.

2. The emergency lighting module of claim 1, wherein the status signal indicative of the status of the AC line voltage comprises an AC line signal and/or a rectified AC line signal.

3. The emergency lighting module of claim 1, wherein the emergency lighting module is configured to monitor the DC input voltage to detect a brownout condition of the AC line voltage.

4. The emergency lighting module of claim 1, wherein the emergency lighting module comprises a second output configured to supply an AC signal to the luminaire.

5. The emergency lighting module of claim 1, wherein the emergency lighting module is configured to supply a control signal to the luminaire that disables an AC/DC converter of the luminaire in response to reduction of the AC line voltage.

6. The emergency lighting module of claim 1, wherein the emergency lighting module is configured to supply a dimming control signal to the luminaire in response to reduction of the AC line voltage.

7. The emergency lighting module of claim 6, wherein the dimming control signal comprises a pulse width modulation (PWM) control signal.

8. The emergency lighting module of claim 7, further comprising a microcontroller configured to monitor the status signal and to generate the PWM control signal in response to reduction of the AC line voltage.

9. The emergency lighting module of claim 8, wherein the microcontroller is configured to generate the PWM control signal, to have a target duty cycle; and wherein the microcontroller is configured to initially generate the PWM control signal to have a first duty cycle that is lower than the target duty cycle and to increase the duty cycle of the PWM control signal from the first duty cycle to the target duty cycle.

10. The emergency lighting module of claim 9, wherein the microcontroller is configured to decrease the duty cycle of the PWM control signal from the target duty cycle to a final duty cycle that is lower than the target duty cycle.

11. The emergency lighting module of claim 10, wherein the microcontroller is configured to maintain the duty cycle of the PWM control signal at the final duty cycle until the AC line voltage is restored or until battery capacity is exceeded.

12. The emergency lighting module of claim 8, further comprising an analog to digital converter configured to receive the DC input voltage and provide a digital signal indicative of a voltage level of the DC input voltage to the microcontroller.

13. The emergency lighting module of claim 1, wherein the emergency lighting module is configured to ramp the DC output voltage up from an initial voltage level to a target voltage level in response to detecting reduction of the AC line signal.

14. The emergency lighting module of claim 1, further comprising:
a charging circuit configured to receive the DC input voltage from the solid state luminaire and responsively generate a charging signal for charging a rechargeable battery coupled to the emergency lighting module.

15. A method of operating an emergency lighting module for providing emergency power to a solid state luminaire, comprising:
receiving a status signal indicative of a status of an AC line voltage;
monitoring the AC line voltage, the solid state luminaire comprising a lighting board, which comprises lighting elements, and a lighting control module that is configured to drive the lighting elements responsive to a logical OR of a DC output voltage and a DC input voltage, the DC input voltage being generated in the solid state luminaire responsive to the AC line voltage; and
generating the DC output voltage in response to reduction of the AC line voltage.

16. The method of claim 15, further comprising:
generating a dimming control signal and supplying the dimming control signal to the solid state luminaire in response to reduction of the AC line voltage.

17. The method of claim 16, wherein the dimming control signal comprises a pulse width modulation (PWM) signal.

18. The method of claim 17 further comprising initially generating the PWM control signal to have a first duty cycle that is lower than a target duty cycle and increasing the duty cycle of the PWM control signal from the first duty cycle to the target duty cycle.

19. The method of claim 18, further comprising decreasing the duty cycle of the PWM control signal from the target duty cycle to a final duty cycle that is lower than the target duty cycle.

20. The method of claim 19, further comprising maintaining the duty cycle of the PWM control signal at the final duty cycle until the AC line voltage is restored.

21. The method of claim 15, further comprising:
receiving a DC input voltage from the solid state luminaire at a charging circuit; and
generating a charging signal for charging a rechargeable battery coupled to the emergency lighting module using the charging circuit.

22. An emergency lighting module for providing emergency power to a solid state luminaire, the emergency lighting module comprising:
a first output configured to supply a DC output voltage to the solid state luminaire responsive to a reduction of an AC line voltage;
a first input configured to receive a DC input voltage from the solid state luminaire, the solid state luminaire comprising a lighting board, which comprises lighting elements, and a lighting control module that is configured to drive the lighting elements responsive to a logical OR of the DC output voltage and the DC input voltage;
a second input configured to receive a status signal indicative of the status of the AC line voltage; and
a microcontroller configured to monitor the status signal and to generate a dimming control signal in response to a reduction of the AC line voltage;
wherein the emergency lighting module is configured to supply the dimming control signal to the lighting control module.

23. The emergency lighting module of claim 22, wherein the dimming control signal comprises a pulse width modulation (PWM) control signal.

24. The emergency lighting module of claim 22, wherein the status signal indicative of the status of the AC line voltage comprises an AC line signal and/or a rectified AC line signal.

25. The emergency lighting module of claim 22, wherein the emergency lighting module is configured to monitor the DC input voltage to detect a brownout condition of the AC line voltage.

26. The emergency lighting module of claim 22, wherein the emergency lighting module comprises a second output configured to supply an AC signal to the luminaire.

27. The emergency lighting module of claim 22, wherein the emergency lighting module is configured to supply a control signal to the luminaire that disables an AC/DC converter of the luminaire in response to reduction of the AC line voltage.

28. The emergency lighting module of claim 27, wherein the dimming control signal comprises a pulse width modulation (PWM) control signal, the emergency lighting module further comprising a microcontroller configured to monitor the status signal and to generate the PWM control signal in response to reduction of the AC line voltage.

29. The emergency lighting module of claim 28, wherein the microcontroller is configured to generate the PWM control signal to have a target duty cycle; and wherein the microcontroller is configured to initially generate the PWM control signal to have a first duty cycle that is lower than the target duty cycle and to increase the duty cycle of the PWM control signal from the first duty cycle to the target duty cycle.

30. The emergency lighting module of claim 29, wherein the microcontroller is configured to decrease the duty cycle of the PWM control signal from the target duty cycle to a final duty cycle that is lower than the target duty cycle.

31. The emergency lighting module of claim 30, wherein the microcontroller is configured to maintain the duty cycle of the PWM control signal at the final duty cycle until the AC line voltage is restored or until battery capacity is exceeded.

32. The emergency lighting module of claim 23, further comprising:
   a charging circuit configured to receive the DC input voltage from the solid state luminaire and responsively generate a charging signal for charging a rechargeable battery coupled to the emergency lighting module.

\* \* \* \* \*

UNITED STATES PATENT AND TRADEMARK OFFICE
CERTIFICATE OF CORRECTION

PATENT NO. : 9,835,691 B2  
APPLICATION NO. : 13/466304  
DATED : December 5, 2017  
INVENTOR(S) : Trainor et al.

Page 1 of 1

It is certified that error appears in the above-identified patent and that said Letters Patent is hereby corrected as shown below:

In the Specification

Column 11, Line 1: Please correct "signal Si" to read -- signal $S_1$ --
    Line 59: Please correct "values of I2, I2" to read -- values of I1, I2 --
    Line 63: Please correct "values of I2 and I2" to read -- values of I1 and I2 --

In the Claims

Column 29, Line 1 Claim 32: Please correct "module of claim 23," to read -- module of claim 22, --

Signed and Sealed this
Tenth Day of December, 2019

Andrei Iancu
*Director of the United States Patent and Trademark Office*